(12) United States Patent
Yu et al.

(10) Patent No.: US 12,119,046 B2
(45) Date of Patent: Oct. 15, 2024

(54) NONVOLATILE MEMORY DEVICE HAVING MULTI-STACK MEMORY BLOCK AND METHOD OF OPERATING THE SAME

(71) Applicant: SAMSUNG ELECTRONICS CO., LTD., Suwon-si (KR)

(72) Inventors: Jaeduk Yu, Seoul (KR); Yohan Lee, Incheon (KR); Yonghyuk Choi, Suwon-si (KR); Jiho Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 189 days.

(21) Appl. No.: 18/045,541

(22) Filed: Oct. 11, 2022

(65) Prior Publication Data

US 2023/0145467 A1 May 11, 2023

(30) Foreign Application Priority Data

Nov. 10, 2021 (KR) .......................... 10-2021-0154261
Jan. 6, 2022 (KR) .......................... 10-2022-0002349

(51) Int. Cl.
*G11C 16/34* (2006.01)
*G11C 11/4074* (2006.01)
(Continued)

(52) U.S. Cl.
CPC ...... *G11C 11/4085* (2013.01); *G11C 11/4074* (2013.01); *G11C 11/4096* (2013.01)

(58) Field of Classification Search
CPC ............ G11C 11/4085; G11C 11/4074; G11C 11/4096
See application file for complete search history.

(56) References Cited

U.S. PATENT DOCUMENTS 10,157,680 B2   12/2018   Yang et al.
10,636,500 B1   4/2020    Chen et al.
(Continued)

FOREIGN PATENT DOCUMENTS

WO   2019245607   12/2019
WO   2020131167   6/2020

OTHER PUBLICATIONS

EESR Dated Mar. 15, 2023 In Corresponding EP Patent Appln. No. 22193938.2.

*Primary Examiner* — Min Huang
(74) *Attorney, Agent, or Firm* — F. Chau & Associates, LLC

(57) ABSTRACT

A nonvolatile memory device having a multi-stack memory block includes: a memory cell array divided into a plurality of memory stacks disposed in a vertical direction; and a control circuit configured to perform a channel voltage equalization operation of the plurality of memory stacks, wherein inter-stack portions are between the plurality of memory stacks, and a channel hole passes through the word lines of each of the plurality of memory stacks. The control circuit determines, as inter-stack word lines, some word lines adjacent to the inter-stack portions among the word lines of each of the plurality of memory stacks and differently controls setup time points for applying a pass voltage, or recovery time points for applying a ground voltage, to the inter-stack word lines, according to sizes of the channel hole of the inter-stack word lines.

20 Claims, 17 Drawing Sheets

(51) Int. Cl.
  *G11C 11/408* (2006.01)
  *G11C 11/4096* (2006.01)

(56) References Cited

U.S. PATENT DOCUMENTS

| | | | |
|---|---|---|---|
| 10,748,926 B2* | 8/2020 | Nishikawa | G11C 16/08 |
| 10,847,228 B2 | 11/2020 | Lee | |
| 10,885,990 B1 | 1/2021 | Jia et al. | |
| 10,957,409 B1 | 3/2021 | Jia et al. | |
| 10,991,438 B1* | 4/2021 | Song | G11C 16/3431 |
| 2015/0294726 A1 | 10/2015 | Sim et al. | |
| 2018/0374541 A1* | 12/2018 | Jung | G11C 16/0483 |
| 2019/0080768 A1 | 3/2019 | Shim | |
| 2019/0318784 A1 | 10/2019 | Lee et al. | |
| 2020/0168280 A1* | 5/2020 | Seo | G11C 16/3427 |

* cited by examiner

NONVOLATILE MEMORY DEVICE HAVING MULTI-STACK MEMORY BLOCK AND METHOD OF OPERATING THE SAME

CROSS-REFERENCE TO RELATED APPLICATIONS

This U.S. non-provisional patent application claims priority under 35 U.S.C. § 119 to Korean Patent Application Nos. 10-2021-0154261, filed on Nov. 10, 2021, and 10-2022-0002349, filed on Jan. 6, 2022 in the Korean Intellectual Property Office, the disclosures of which are incorporated by reference in their entireties herein.

TECHNICAL FIELD

The inventive concept relates to semiconductor memory devices, and more particularly, to a nonvolatile memory device having a multi-stack memory block, and a method of operating the nonvolatile memory device.

DISCUSSION OF RELATED ART

A system using semiconductor chips typically uses dynamic random access memory (DRAM) as a main memory and a nonvolatile memory to store data or instructions. An increase in a capacity of a storage device causes an increase in the number of memory cells stacked on a substrate of a nonvolatile memory, an increase in the number of word lines, and an increase in the number of bits of data stored in a memory cell. A three-dimensional (3D) NAND flash memory device, having memory cells stacked in a 3D structure may be used to implement the storage device to have a higher storage capacity and degree of integration.

The 3D NAND flash memory device includes a memory cell array formed in a multi-stack memory block structure. The memory cell array includes a plurality of cell strings respectively disposed between a plurality of bit lines and a source line in a vertical direction with respect to a substrate. The multi-stack memory block structure may have stacked memory stacks having gate lines corresponding to word lines and include an inter-stack portion between the memory stacks. In this case, the inter-stack portion may be formed to be relatively longer than a length between gate lines of a memory stack in a manufacturing process. The inter-stack portion is included in a channel region of each cell string, and thus, it is required even in the inter-stack portion that a channel potential or a channel voltage be equalized. If the channel potential is not equalized in the inter-stack portion, a hot carrier injection (HCI) may occur when channel boosting occurs by word lines in a program operation or a read operation.

SUMMARY

At least one embodiment of the inventive concept provides a nonvolatile memory device having a multi-stack memory block, of which a channel potential is equalized by differently controlling operating time points of word lines adjacent to an inter-stack portion between memory stacks, and a method of operating the nonvolatile memory device.

According to an embodiment of the inventive concept, there is provided a nonvolatile memory device including: a memory cell array and a control circuit. The memory cell array includes a plurality of cell strings in which a plurality of memory cells are disposed in a vertical direction, respectively. The memory cell array is divided into a plurality of memory stacks disposed in the vertical direction. Inter-stack portions are disposed between the plurality of memory stacks. Word lines of the plurality of memory cells are stacked in the vertical direction in each of the plurality of memory stacks. A channel hole passes through the word lines of each of the plurality of memory stacks. The control circuit is configured to determine, as inter-stack word lines, some word lines adjacent to the inter-stack portions among the word lines of each of the plurality of memory stacks and perform a channel voltage equalization operation of the plurality of memory stacks while differently controlling setup time points for applying a pass voltage to the inter-stack word lines, according to sizes of the channel hole of the inter-stack word lines. The pass voltage is set to a voltage by which the plurality of memory cells are turned on.

According to an embodiment of the inventive concept, there is provided a method of operating a nonvolatile memory device. The method includes: dividing, into a plurality of memory stacks, a memory cell array including a plurality of cell strings in which a plurality of memory cells are disposed in a vertical direction, respectively, wherein inter-stack portions are disposed between the plurality of memory stacks, word lines of the plurality of memory cells are stacked in the vertical direction in each of the plurality of memory stacks, and a channel hole passes through the word lines of each of the plurality of memory stacks; determining, as inter-stack word lines, some word lines adjacent to the inter-stack portions among the word lines of each of the plurality of memory stacks; and performing a channel voltage equalization operation of the plurality of memory stacks while differently controlling setup time points for applying a pass voltage to the inter-stack word lines, according to sizes of the channel hole of the inter-stack word lines. The pass voltage is set to a voltage by which the plurality of memory cells are turned on.

According to an embodiment of the inventive concept, there is provided a method of operating a nonvolatile memory device. The method includes: dividing, into a plurality of memory stacks, a memory cell array including a plurality of cell strings in which a plurality of memory cells are disposed in a vertical direction, respectively, wherein inter-stack portions are disposed between the plurality of memory stacks, word lines of the plurality of memory cells are stacked in the vertical direction in each of the plurality of memory stacks, and a channel hole passes through the word lines of each of the plurality of memory stacks; determining, as inter-stack word lines, some word lines adjacent to the inter-stack portions among the word lines of each of the plurality of memory stacks; and performing a channel voltage equalization operation of the plurality of memory stacks while differently controlling recovery time points for applying a recovery voltage to the inter-stack word lines, according to sizes of the channel hole of the inter-stack word lines.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
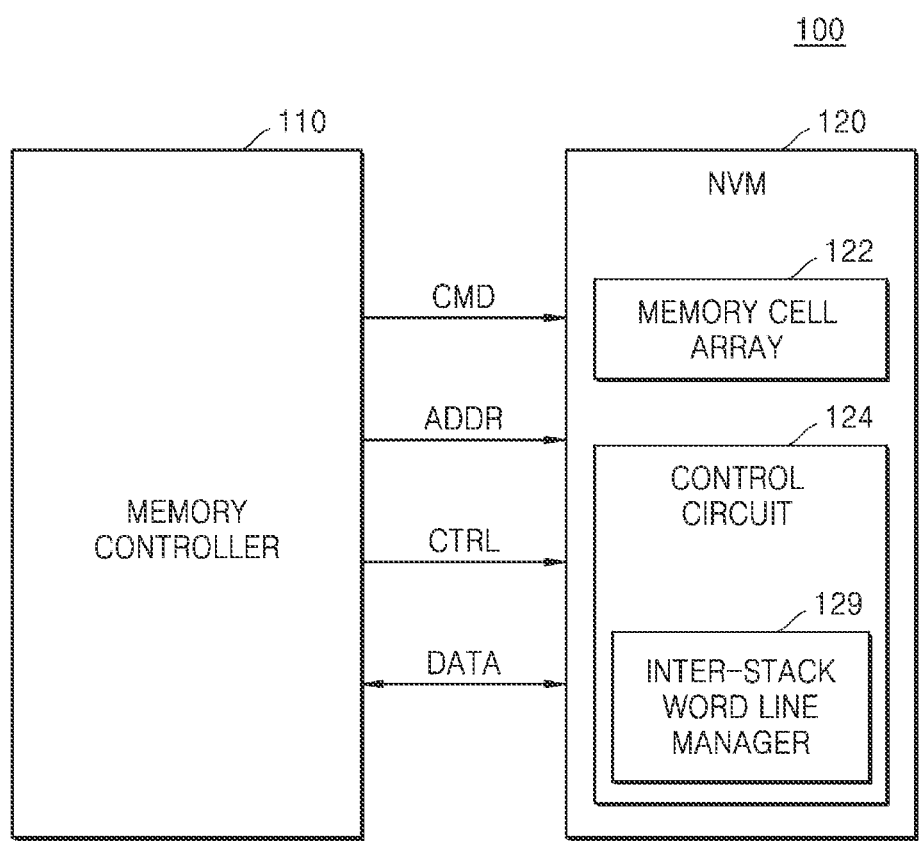
FIG. 1 is a block diagram illustrating a memory system according to an embodiment of the inventive concept.

FIG. 1 is a block diagram illustrating a memory system 100 according to an embodiment of the inventive concept.

Referring to FIG. 1, the memory system 100 include a memory controller 110 (e.g., a control circuit) and at least one memory device, e.g., a nonvolatile memory device 120. Although a plurality of conceptual hardware components included in the memory system 100 are shown in the present embodiment, the present embodiment is not limited thereto, and other components may be included. The memory controller 110 control writing of data to the memory device 120, in response to a write request from a host, or control reading of data from the memory device 120, in response to a read request from the host.

In some embodiments, the memory system 100 may be an internal memory embedded in an electronic device. For example, the memory system 100 may be an embedded universal flash storage (UFS) memory device, an embedded multi-media card (eMMC), or a solid state drive (SSD). In some embodiments, the memory system 100 may be an external memory detachably attachable to an electronic device. For example, the memory system 100 may include at least one of a UFS memory card, a compact flash (CF) card, a secure digital (SD) card, a micro secure digital (Micro-SD) card, a mini secure digital (Mini-SD) card, an extreme digital (xD) card, and a memory stick.

The memory device 120 may perform an erase operation, a program operation, a read operation, or the like under control by the memory controller 110. The memory device 120 may receive a command CMD and an address ADDR from the memory controller 110 through input/output lines and transmit and receive data DATA for a program operation or a read operation to and from the memory controller 110. In addition, the memory device 120 may receive a control signal CTRL through a control line. The memory device 120 may include a memory cell array 122 and a control circuit 124.

The memory cell array 122 may include a plurality of memory blocks, and each of the plurality of memory blocks may include a plurality of memory cells, e.g., flash memory cells. Hereinafter, embodiments of the inventive concept are described in detail based on an example in which the plurality of memory cells are NAND flash memory cells. The memory cell array 122 may include a three-dimensional (3D) memory cell array including a plurality of cell strings, and this is described in detail with reference to FIGS. 3 to 6.

The 3D memory cell array is monolithically formed in at least one physical level of memory cell arrays having an active area disposed on a silicon substrate and a circuit formed on or in the substrate as a circuit associated with an operation of memory cells. The term "monolithic" indicates that layers of each level forming the array are stacked immediately on layers of each lower level in the array. In an embodiment of the inventive concept, a 3D memory cell array includes cell strings disposed in a vertical direction so that at least one memory cell is disposed on another memory cell. The at least one memory cell may include a charge trap layer. U.S. Pat. Nos. 7,679,133, 8,553,466, 8,654,587, and 8,559,235 and US Patent Application No. 2011/0233648, which disclose in detail appropriate configurations of a 3D memory array in which a 3D memory array is formed in a plurality of levels, and word lines and/or bit lines are shared among the levels, are herein incorporated by reference in their entireties.

Figure 4:
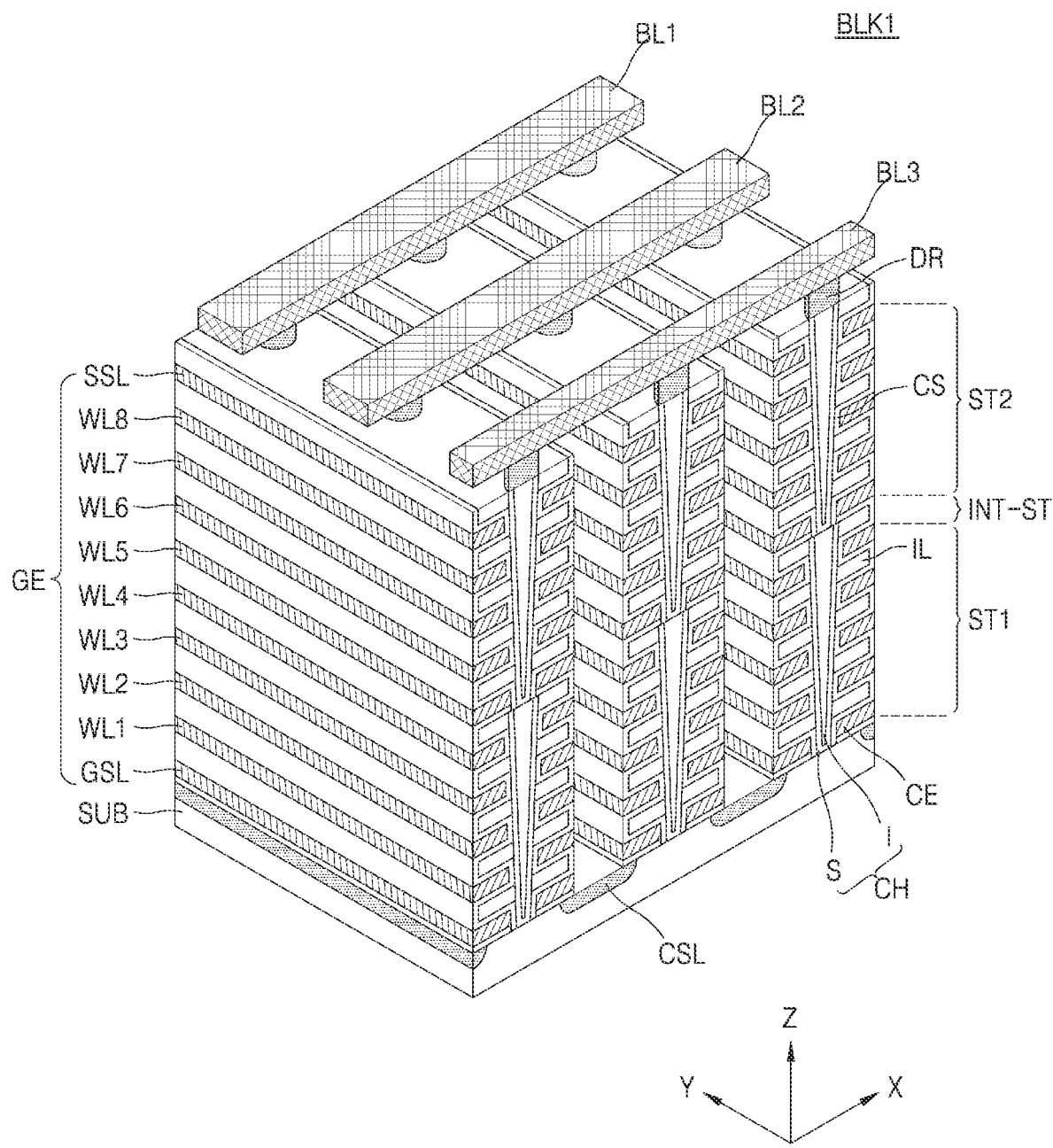
FIG. 4 is a perspective view illustrating a memory block according to an embodiment of the inventive concept.
Figure 15:
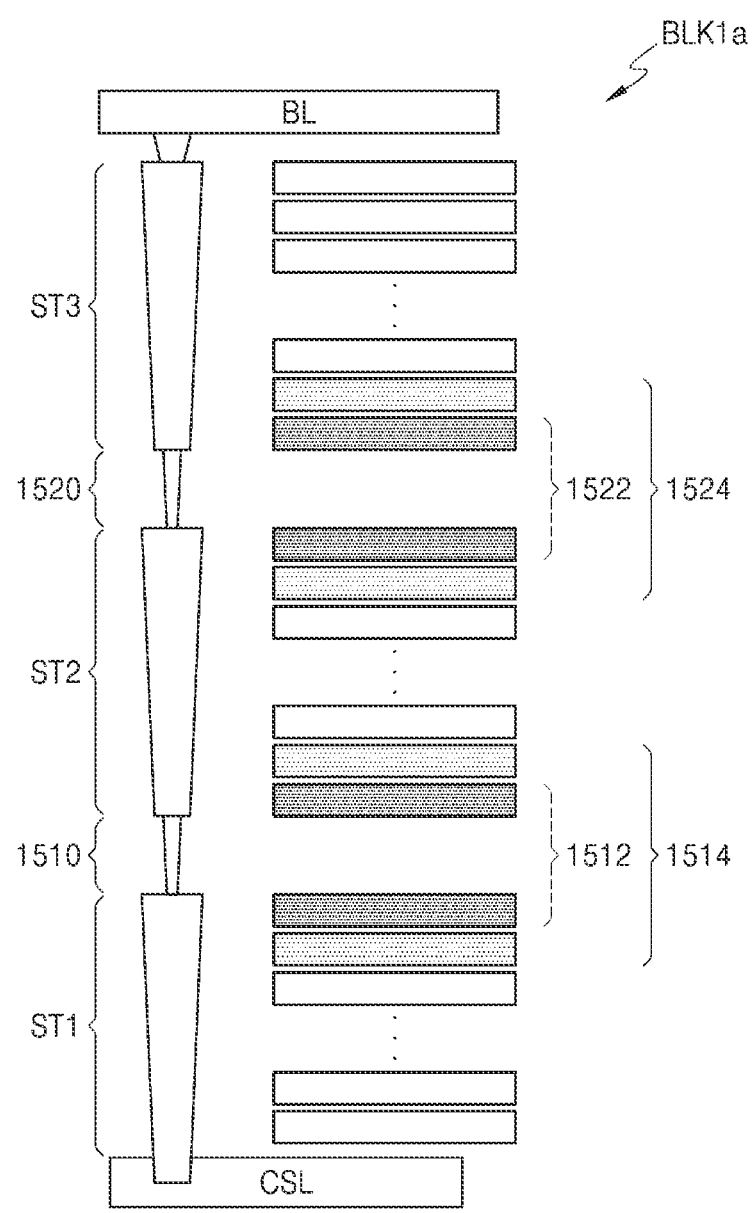
FIG. 15 is a cross-sectional view illustrating a memory block according to an embodiment of the inventive concept.

A memory block in the memory cell array 122 may include a first memory stack ST1 and a second memory stack ST2 stacked in the vertical direction, as shown in FIG. 4. An inter-stack portion INT-ST may be included between the first memory stack ST1 and the second memory stack ST2. According to an embodiment, the memory block may include three or more memory stacks ST1, ST2, and ST3, as shown in FIG. 15.

The control circuit 124 may perform a program operation in response to a program command from the memory controller 110 so that threshold voltages of memory cells of a certain page, which are adjacent to each other at the same location from a substrate of the memory cell array 122, have a plurality of target states. A program operation may be performed by program loops based on a voltage increase portion of a program voltage, and each of the program loops may include a program period and a verify period. The control circuit 124 may perform a read operation on a memory cell selected from among memory cells included in the memory cell array 122, in response to a read command from the memory controller 110.

In an embodiment, the control circuit 124 includes an inter-stack word line manager 129. The inter-stack word line manager 129 stores channel hole profile information of some word lines adjacent to inter-stack portions INT-ST. The inter-stack portions INT-ST may be defined in a manufacturing process step of the nonvolatile memory device 120. The inter-stack word line manager 129 may determine, to be inter-stack word lines, some word lines adjacent to inter-stack portions INT-ST among word lines of each of a plurality of memory stacks in the memory cell array 122, based on the channel hole profile information. The channel hole profile information may indicate addresses or locations of word lines adjacent or near a given inter-stack portion and whether they are considered to have high or low resistance. For example, the channel hole profile information may include for a given inter-stack portion, locations or addresses of one or more first word lines that are near or adjacent the given inter-stack portion that have a first resistance and locations or addresses of one or more second word lines that are near or adjacent the given inter-stack portion that have a second other different resistance. The inter-stack word lines may include the first word lines and the second word lines.

According to an embodiment, the inter-stack word line manager 129 performs a channel voltage equalization operation of the plurality of memory stacks while differently controlling setup time points for applying a pass voltage to the inter-stack word lines, according to sizes of a channel hole of the inter-stack word lines. The inter-stack word line manager 129 may first set a first inter-stack word line having a larger channel hole and later set a second other inter-stack word line having a smaller channel hole when the inter-stack word lines are set to the pass voltage. For example, the pass voltage may be first applied to the first inter-stack word line (e.g., WL4) of a given inter-stack portion and the pass voltage may then be applied to the second inter-stack word line (e.g., WL5) of the given inter-stack portion.

According to an embodiment, the inter-stack word line manager 129 performs a channel voltage equalization operation of the plurality of memory stacks while differently controlling recovery time points for applying a recovery voltage to the inter-stack word lines, according to sizes of a channel hole of the inter-stack word lines. In an embodiment, the inter-stack word line manager 129 first recovers an inter-stack word line having a smaller channel hole and later recovers an inter-stack word line having a larger channel hole when the inter-stack word lines are recovered to the recovery voltage. For example, the recovery voltage may be first applied to the first inter-stack word line (e.g., WL4) and the recovery voltage may then be applied to the second inter-stack word line (e.g., WL5) of the given inter-stack portion.

Although FIG. 1 shows that the inter-stack word line manager 129 is included in the control circuit 124, the inter-stack word line manager 129 according to an embodiment of the inventive concept may be implemented as a separate component outside the control circuit 124.

Figure 2:
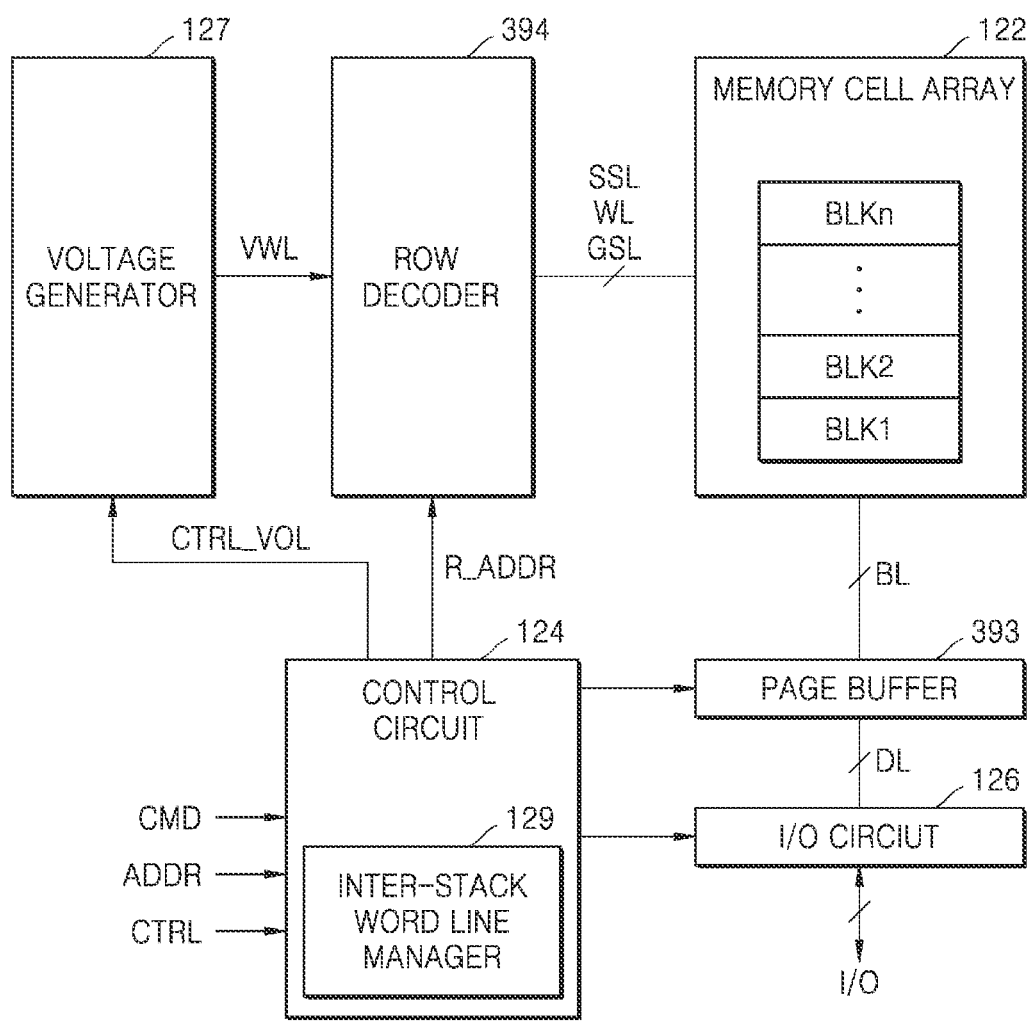
FIG. 2 is a block diagram illustrating a memory device according to an embodiment of the inventive concept.

FIG. 2 is a block diagram illustrating the memory device 120 according to embodiments of the inventive concept. FIG. 2 illustrates a schematic configuration of a flash memory device. The configuration of the flash memory device shown in FIG. 2 is provided as an example, and FIG. 2 is not necessarily an actual flash memory device configuration. In addition, the configuration of the flash memory device shown in FIG. 2 does not indicate or imply limitation to the inventive concept. For convenience of description, the memory device 120 may be referred to as a flash or nonvolatile memory device 120.

Referring to FIGS. 1 and 2, the memory device 120 may include the memory cell array 122, a row decoder 394 (e.g., a decoder circuit), the control circuit 124, a page buffer 393, an input/output (I/O) circuit 126, and a voltage generator 127. Although not shown, the memory device 120 may further include an I/O interface.

The memory cell array 122 may be connected to a plurality of word lines WL, a plurality of string select lines SSL, a plurality of ground select lines GSL, and a plurality of bit lines BL. The memory cell array 122 may be connected to the row decoder 394 via the plurality of word lines WL, the plurality of string select lines SSL, and the plurality of ground select lines GSL and connected to the page buffer 393 via the plurality of bit lines BL. The memory cell array 122 may include a plurality of memory blocks BLK1 to BLKn.

Each of the plurality of memory blocks BLK1 to BLKn may include a plurality of memory cells and a plurality of select transistors. The plurality of memory cells may be respectively connected to the plurality of word lines WL, and the plurality of select transistors may be respectively connected to the plurality of string select lines SSL or the plurality of ground select lines GSL. Each memory cell may store one or more bits, and for example, each memory cell may correspond to a multi-level cell (MLC), a triple-level cell (TLC), or a quadruple-level cell (QLC).

The row decoder 394 may be connected to the memory cell array 122 via the plurality of string select lines SSL, the plurality of word lines WL, and the plurality of ground select lines GSL. In a program operation or a read operation, the row decoder 394 may determine one of the plurality of word lines WL as a selected word line and the other word lines WL as unselected word lines, based on a row address R_ADDR provided from the control circuit 124. In addition, in a program operation or a read operation, the row decoder 394 may determine one of the plurality of string select lines SSL as a selected string select line and the other string select lines SSL as unselected string select lines, based on the row address R_ADDR provided from the control circuit 124.

The control circuit 124 may output various kinds of internal control signals for performing program, read, and erase operations on the memory cell array 122, based on the command CMD, the address ADDR, and the control signal CTRL transmitted from the memory controller 110. The control circuit 124 may provide the row address R_ADDR to the row decoder 394, a column address to the I/O circuit 126, and a voltage control signal CTRL_VOL to the voltage generator 127.

The page buffer 393 may operate as a write driver or a sense amplifier according to an operating mode. In a read operation, the page buffer 393 may sense a bit line BL of a selected memory cell under control by the control circuit 124. Sensed data may be stored in latches included in the page buffer 393. The page buffer 393 may transfer data stored in the latches to the I/O circuit 126 via data lines DL under control by the control circuit 124.

The I/O circuit 126 may be connected to the page buffer 393 via the data lines DL. In a program operation, the I/O circuit 126 may receive program data from the memory controller 110 and provide the program data to the page buffer 393, based on a column address provided from the control circuit 124. In a read operation, the I/O circuit 126 may provide read data stored in the page buffer 393 to the memory controller 110, based on a column address provided from the control circuit 124.

The voltage generator 127 may generate various types of voltages for performing program, read, and erase operations on the memory cell array 122, based on the voltage control signal CTRL_VOL. Particularly, the voltage generator 127 may generate a word line voltage VWL, e.g., a program voltage, a verify voltage, a read voltage, a pass voltage, an erase voltage, an erase verify voltage, and the like.

In an embodiment, the control circuit 124 includes the inter-stack word line manager 129. The inter-stack word line manager 129 may be configured to differently control operating time points of word lines adjacent to an inter-stack portion between memory stacks. The inter-stack word line manager 129 may be implemented by hardware, firmware, software, or a combination thereof to control or manage inter-stack word lines. Although it is described in embodiments below that the inter-stack word line manager 129 determines, as inter-stack word lines, some word lines adjacent to an inter-stack portion among word lines of memory stacks, based on channel hole profile information, and controls the inter-stack word lines, embodiments of the inventive concept are not limited thereto. For example, the inter-stack word line manager 129 corresponds to a component included in the control circuit 124, and it may be described that the control circuit 124 controls the inter-stack word lines.

Figure 3:
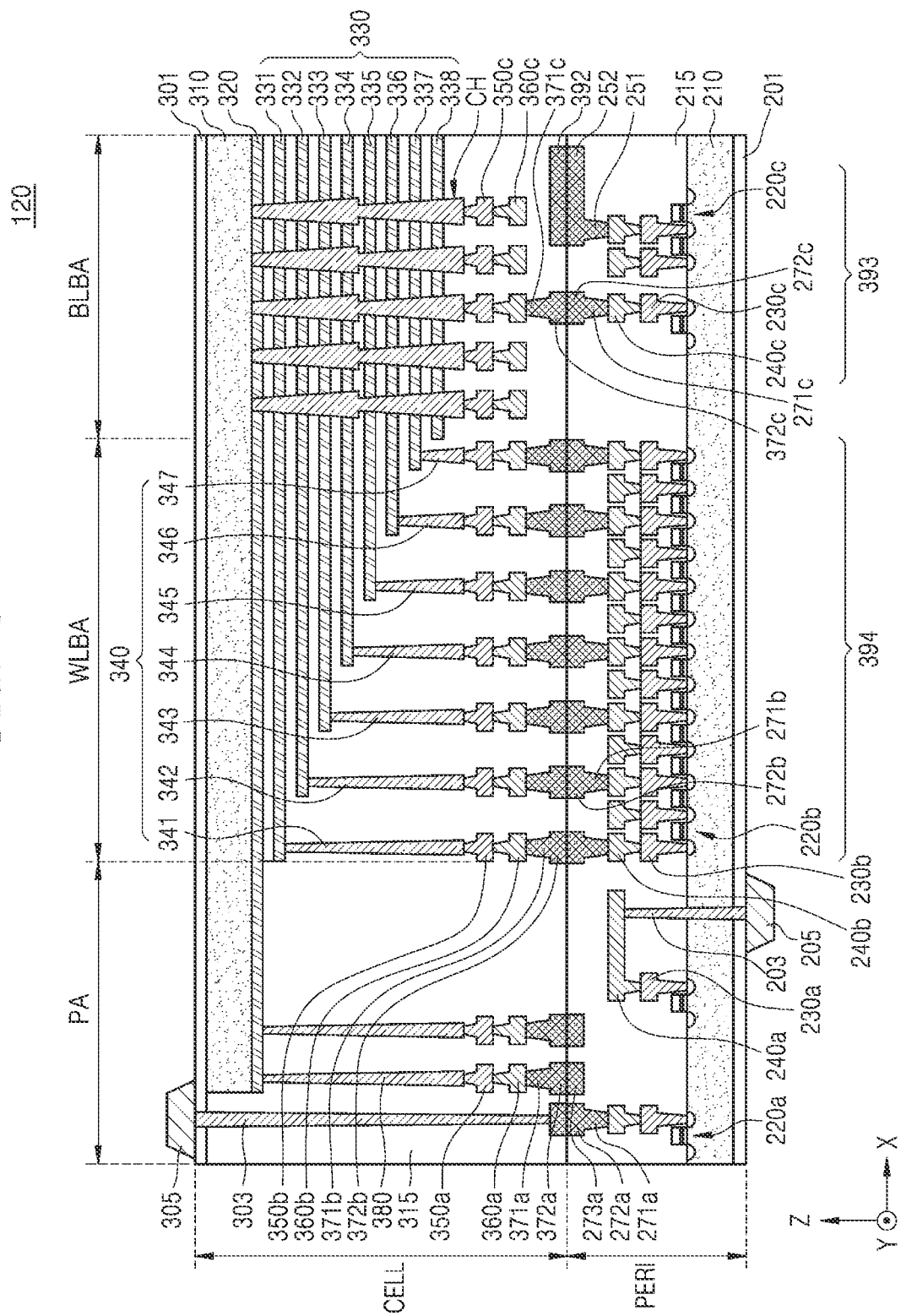
FIG. 3 is a cross-sectional view for describing a structure of a memory device according to an embodiment of the inventive concept.

FIG. 3 is a cross-sectional view for describing a structure of the memory device 120 according to an embodiment of the inventive concept.

Referring to FIG. 3, the memory device 120 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip to a bonding metal formed on an uppermost metal layer of the lower chip. For example, when the bonding metals may include copper (Cu) using Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 120 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a. 230b, and 230c may be formed of tungsten having relatively high electrical resistivity, and the second metal layers 240a, 240b, and 240c may be formed of copper having relatively low electrical resistivity.

Although only the first metal layers 230a, 230b, and 230c and the second metal layers 240a, 240b, and 240c are shown and described in FIG. 3, embodiments of the inventive concept are not limited thereto, and one or more additional metal layers may be further formed on the second metal layers 240a, 240b, and 240c. At least a portion of the one or more additional metal layers formed on the second metal layers 240a. 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material, such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Furthermore, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (the Z-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In the example embodiment illustrated in FIG. 3, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material, such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 3, a lower insulating film 201 covering a lower surface of the first substrate 210 may be formed below the first substrate 210, and the first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 3, an upper insulating film 301 covering the upper surface of the second substrate 310 may be formed on the second substrate 310, and the second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In the example embodiment, the second input-output pad 305 is electrically connected to a circuit element 220a.

According to an embodiment, the second substrate 310 and the common source line 320 are not disposed in an area in which the second input-output contact plug 303 is disposed. Also, in an embodiment, the second input-output pad 305 does not overlap the word lines 330 in the third direction (the Z-axis direction). Referring to FIG. 3, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 120 may include only the first input-output pad 205 disposed on the first substrate 210 or the second input-output pad 305 disposed on the second substrate 310. Alternatively, the memory device 120 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA respectively included in the cell region CELL and the peripheral circuit region PERI.

In the external pad bonding area PA, the memory device 120 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, the upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by Cu-to-Cu bonding.

Furthermore, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. In an embodiment, a contact is not formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The memory device 120 may have a memory cell array formed in a multi-stack memory block structure, the memory cell array including a plurality of cell strings respectively disposed between a plurality of bit lines and a source line in the vertical direction with respect to a substrate. In the bit line bonding area BLBA of FIG. 3, the plurality of word lines 331 to 338 (i.e., 330) between string select lines and a ground select line may be grouped into two memory stacks, as shown in FIG. 4. An inter-stack portion INT-ST (see FIG. 4) may be between the two memory stacks. A channel structure CH (see FIG. 4) is formed even in the inter-stack portion INT-ST, and this is particularly described with reference to FIGS. 4 and 5.

Figure 5:
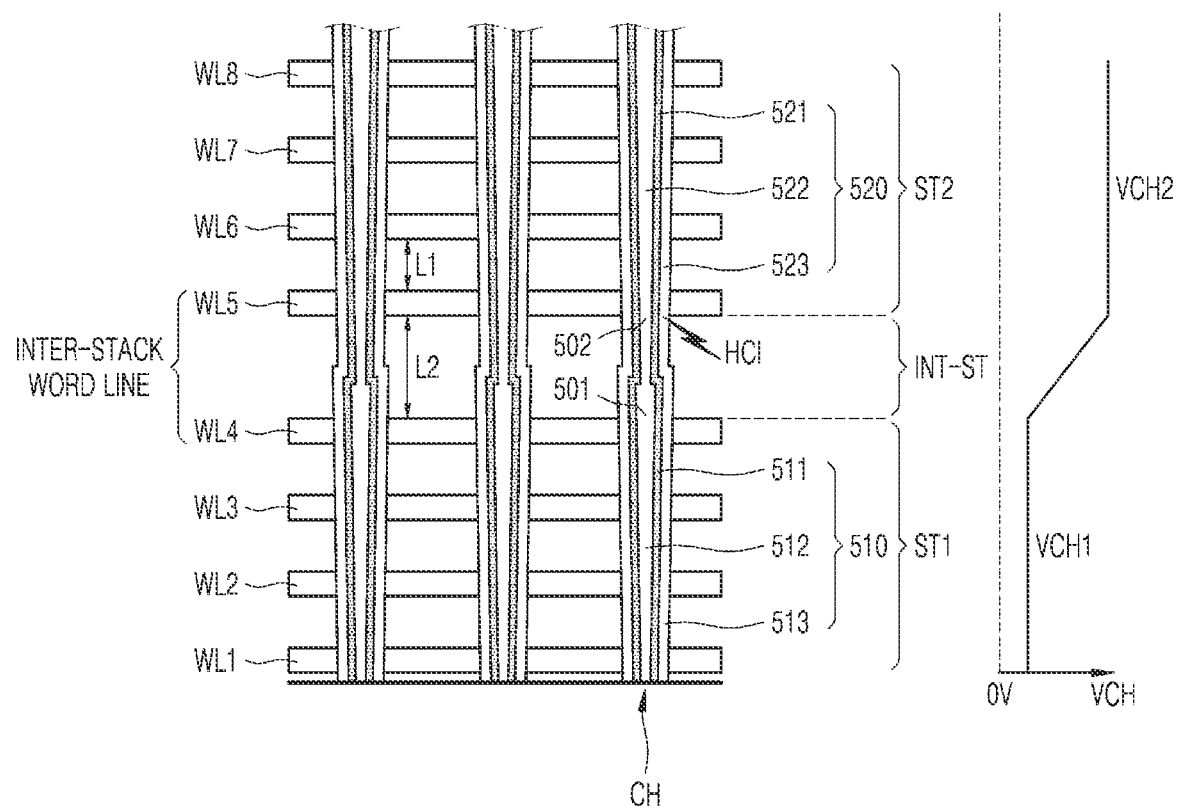
FIG. 5 is a cross-sectional view for describing an example of an inter-stack portion included in the memory block of FIG. 4.

FIG. 4 is a perspective view illustrating the memory block BLK1 according to an embodiment of the inventive concept. FIG. 5 is a cross-sectional view for describing an example of an inter-stack portion INT-ST included in the memory block BLK1 of FIG. 4. FIG. 4 representatively shows the memory block BLK1 among the plurality of memory blocks BLK1 to BLKn of FIG. 2. The memory block BLK1 may include NAND strings or cell strings formed in a 3D structure or a vertical structure. The memory block BLK1 may include structures extending in a plurality of directions (X-, Y-, and Z-axes directions).

Referring to FIG. 4, the memory block BLK1 is formed in the vertical direction (the Z-axis direction) with respect to a substrate SUB. The substrate SUB may have a first conductive type (e.g., p type), and a common source line CSL doped with impurities of a second conductive type (e.g., n type) may be formed in the substrate SUB.

Above a region of the substrate SUB between common source lines CSL, a plurality of insulating materials IL extending in a second horizontal direction (the Y-axis direction) are sequentially disposed in the vertical direction (the Z-axis direction). For example, the plurality of insulating materials IL may be formed by being separated by a certain distance in a first horizontal direction (the X-axis direction). For example, the plurality of insulating materials IL may include an insulating material, such as silicon oxide.

On the substrate SUB between the common source lines CSL, a plurality of channel structures CH sequentially arranged in the second horizontal direction (the Y-axis direction) and passing through the plurality of insulating materials IL in the vertical direction (the Z-axis direction) are formed. For example, the plurality of channel structures CH may be connected to the substrate SUB by passing through the plurality of insulating materials IL. For example, each channel structure CH may include a plurality of materials. A surface layer S of each channel structure CH may include a silicon material having the first conductive type and function as a channel region. In some embodiments, the channel structure CH may be referred to as a vertical channel structure or a pillar. An inner layer I of each channel structure CH may include an insulating material, such as silicon oxide, or an air gap.

A charge storage layer CS is provided along the plurality of insulating materials IL, the plurality of channel structures CH, and an exposed surface of the substrate SUB. The charge storage layer CS may include a gate insulating layer (or referred to as "tunneling insulating layer"), a charge trap layer, and a blocking insulating layer. For example, the charge storage layer CS may have an oxide-nitride-oxide (ONO) structure. In addition, a gate electrode GE including a ground select line GSL, a string select line SSL, and first to eighth word lines WL1 to WL8 is provided on an exposed surface of the charge storage layer CS.

Drain contacts or drains DR are provided on the plurality of channel structures CH, respectively. For example, the drains DR may include a silicon material doped with impurities having the second conductive type. On the drains DR, bit lines, e.g., first to third bit lines BL1 to BL3 extending in the first horizontal direction (the X-axis direction) and separated by a certain distance in the second horizontal direction (the Y-axis direction), are disposed.

The memory block BLK1 may include a first memory stack ST1 and a second memory stack ST2 stacked in the vertical direction (the Z-axis direction). For example, the first memory stack ST1 may include the first to fourth word lines WL1 to WL4, and the second memory stack ST2 may include the fifth to eighth word lines WL5 to WL8. The inter-stack portion INT-ST may be formed between the first memory stack ST1 and the second memory stack ST2 to ensure the structural stability of the memory device 120 during a process of manufacturing the memory device 120. While FIG. 4 illustrates each stack including four word lines, embodiments of the inventive concept are not limited thereto as each stack may include more than four word lines and a different number of word lines from one another.

Referring to FIG. 5, a channel hole constituting a cell string in each channel structure CH may include a first sub-channel hole 510 and a second sub-channel hole 520. The first sub-channel hole 510 formed in the first memory stack ST1 may include a channel layer 511, an internal material 512, and an insulating layer 513. The second sub-channel hole 520 formed in the second memory stack ST2 may include a channel layer 521, an internal material 522, and an insulating layer 523. The channel layer 511 of the first sub-channel hole 510 may be connected to the channel layer 521 of the second sub-channel hole 520.

At a connection part between the channel layer 511 of the first sub-channel hole 510 and the channel layer 521 of the second sub-channel hole 520 in the inter-stack portion INT-ST, a size 502 of the second sub-channel hole 520 may be smaller than a size 501 of the first sub-channel hole 510. Accordingly, an overlap margin may be ensured at the connection part between the channel layer 511 of the first sub-channel hole 510 and the channel layer 521 of the second sub-channel hole 520. To increase the overlap margin in a manufacturing process, the inter-stack portion INT-ST may be formed to be long in the vertical direction. Accordingly, a length L2 of the inter-stack portion INT-ST may be relatively greater than a gap L1 between every two of the first to fourth word lines WL1 to WL4 and the fifth to eighth word lines WL5 to WL8 in the first and second memory stacks ST1 and ST2.

In each of the first to eighth word lines WL1 to WL4 and WL5 to WL8, a remaining region excluding a region through which the first or second sub-channel hole 510 or 520 passes from a corresponding region of the gate electrode GE is represented by a resistance value of a corresponding one of the first to eighth word lines WL1 to WL4 and WL5 to WL8. The greater a size of the first or second sub-channel hole 510 or 520, which each of the first to eighth word lines WL1 to WL4 and WL5 to WL8 has, the greater a word line resistance value, and the smaller the size of the first or second sub-channel hole 510 or 520, which each of the first to eighth word lines WL1 to WL4 and WL5 to WL8 has, the smaller the word line resistance value.

For example, the fourth word line WL4 at a top of the first memory stack ST1 may have a relatively larger size of the first sub-channel hole 510 than the other word lines, i.e., the first to third word lines WL1 to WL3 of the first memory stack ST1. Therefore, a resistance value of the fourth word line WL4 at the top of the first memory stack ST1 may be relatively large. The fifth word line WL5 at a bottom of the second memory stack ST2 may have a relatively smaller size of the second sub-channel hole 520 than the other word lines, i.e., the sixth to eighth word lines WL6 to WL8 of the second memory stack ST2. Therefore, a resistance value of the fifth word line WL5 at the bottom of the second memory stack ST2 may be relatively small.

According to a resistance value difference between the fourth word line WL4 and the fifth word line WL5, which are adjacent to the inter-stack portion INT-ST, a first channel voltage VCH1 of a cell string of the first memory stack ST1 and a second channel voltage VCH2 of a cell string of the second memory stack ST2 may be differently boosted. As shown in FIG. 5, the first channel voltage VCH1 associated with the fourth word line WL4 having a large resistance value may be less boosted, and the second channel voltage VCH2 associated with the fifth word line WL5 having a small resistance value may be more boosted. Because the inter-stack portion INT-ST is included in a channel region of each cell string, if a difference between the first channel voltage VCH1 and the second channel voltage VCH2 is greater than a certain range, hot carrier injection (HCI) due to the channel voltage difference may occur. Accordingly, a threshold voltage state of a memory cell adjacent to the inter-stack portion INT-ST may be distorted.

In a process step of forming the first sub-channel hole 510 and the second sub-channel hole 520, which constitute a channel hole of each cell string, channel hole profile information may be obtained. A channel hole profile may be defined in a manufacturing process step of the nonvolatile memory device 120, and the inter-stack word line manager 129 may store channel hole profile information of word lines adjacent to the inter-stack portion INT-ST, which is defined in the manufacturing process step. In an embodiment, the inter-stack word line manager 129 determines, to be inter-stack word lines, some word lines having a large resistance value difference among word lines adjacent to the inter-stack portion INT-ST, based on the channel hole profile information.

The inter-stack word line manager 129 may determine, to be inter-stack word lines, word line(s) adjacent to the inter-stack portion INT-ST in each of the first and second memory stacks ST1 and ST2. For example, the inter-stack word line manager 129 may determine the fourth word line WL4 of the first memory stack ST1 and the fifth word line WL5 of the second memory stack ST2 to be inter-stack word lines of the inter-stack portion INT-ST. To prevent HCI due to a difference between the first channel voltage VCH1 and the second channel voltage VCH2 in the inter-stack portion INT-ST, the inter-stack word line manager 129 may control operating time points of the inter-stack word lines (e.g., the fourth and fifth word lines WL4 and WL5). By controlling the operating time points of the inter-stack word lines (e.g., the fourth and fifth word lines WL4 and WL5), channel potential equalization of the inter-stack portion INT-ST may be implemented.

Figure 6:
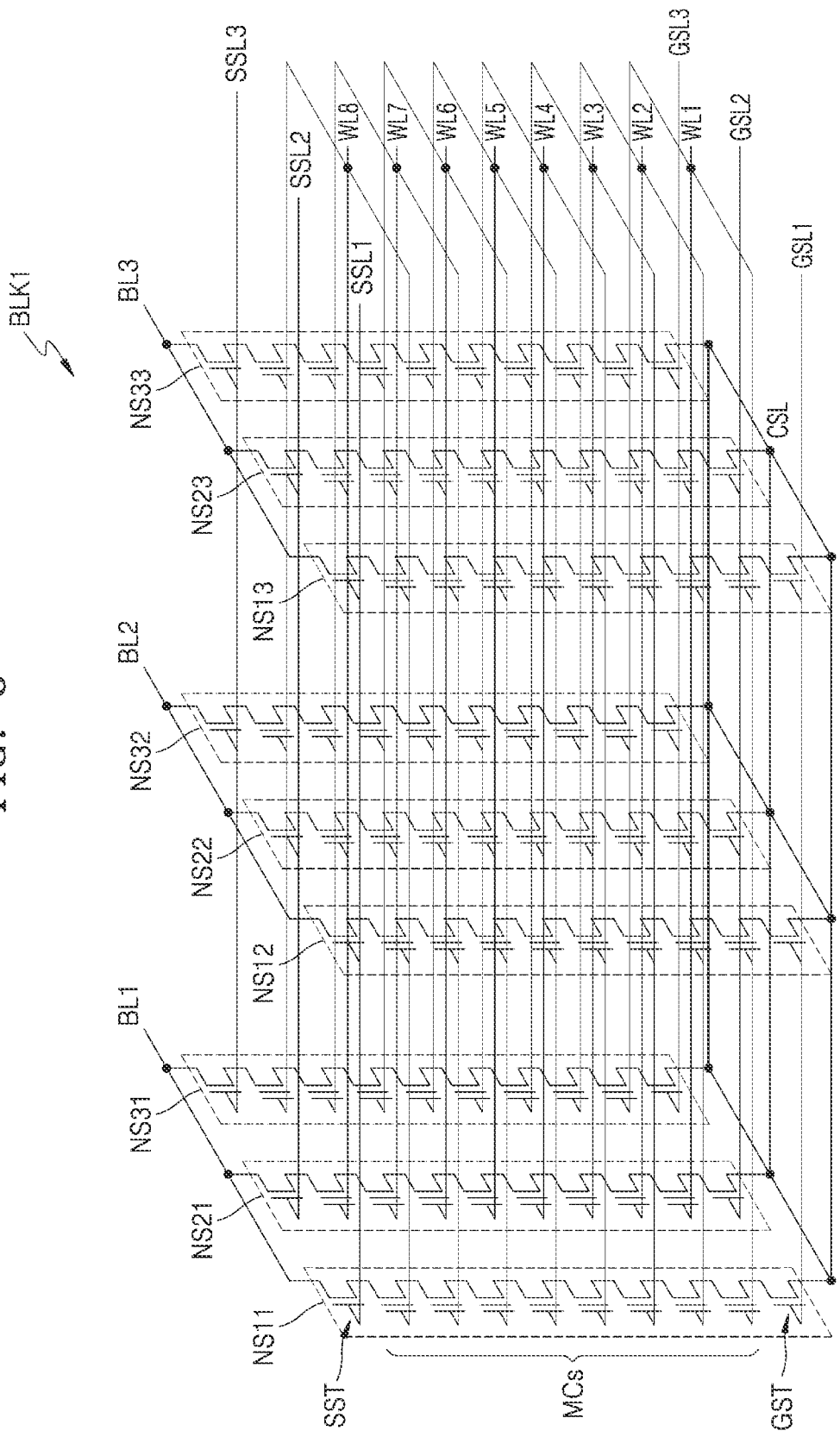
FIG. 6 is an equivalent circuit diagram of the memory block of FIG. 4.

FIG. 6 is an equivalent circuit diagram of the memory block BLK1 of FIG. 4.

Referring to FIG. 6, the memory block BLK1 may include NAND strings, e.g., cell strings NS11 to NS33, the first to eighth word lines WL1 to WL8, the first to third bit lines BL1 to BL3, ground select lines, e.g., first to third ground select lines GSL1 to GSL3, string select lines, e.g., first to third string select lines SSL1 to SSL3, and a common source line CSL. Although FIG. 6 shows that each of the cell strings NS11 to NS33 includes eight memory cells MC respectively connected to eight word lines, e.g., the first to eighth word lines WL1 to WL8, the inventive concept is not limited thereto.

Each cell string (e.g., NS11) may include a string select transistor SST, a plurality of memory cells MC, and a ground select transistor GST, which are connected in series. The string select transistor SST is connected to a corresponding string select line, e.g., the first string select line SSL1. The plurality of memory cells MC are connected to corresponding word lines, e.g., the first to eighth word lines WL1 to WL8, respectively. The ground select transistor GST is connected to a corresponding ground select line, e.g., the first ground select line GSL1. The string select transistor SST is connected to a corresponding bit line BL1, BL2, or BL3, and the ground select transistor GST is connected to the common source line CSL.

According to an embodiment, in each cell string, one or more dummy memory cells may be provided between a string select transistor SST and memory cells MC. In each cell string, one or more dummy memory cells may be provided between a ground select transistor GST and memory cells MC. In each cell string, one or more dummy memory cells may be provided between memory cells MC. The dummy memory cells have the same structure as the memory cells MC and may not be programmed (e.g., program-prohibited) or may be programmed to be different from the memory cells MC. For example, when the memory cells MC are programmed to have two or more threshold voltage distributions, the dummy memory cells may be programmed to have one threshold voltage distribution range or a less number of threshold voltage distributions than the memory cells MC.

Figure 7:
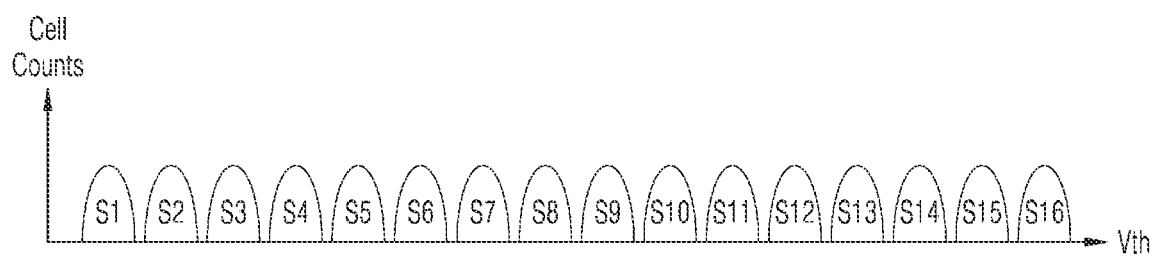
FIG. 7 illustrates a threshold voltage distribution when write data is written to memory cells shown in FIG. 6.

FIG. 7 illustrates a threshold voltage distribution when write data is written to the memory cells MC shown in FIG. 6. In FIG. 7, the horizontal axis indicates threshold voltages of the memory cells MC, and the vertical axis indicates cell counts, i.e., the number of memory cells MC.

Referring to FIGS. 6 and 7, one or more bits may be programmed in a memory cell MC. According to the number of bits stored in the memory cell MC, the memory cell MC may be classified into a single-level cell (SLC), an MLC, a TLC, or a QLC. The memory cell MC may have a plurality of states according to the numbers of bits stored in the memory cell MC. The plurality of states may be defined by ranges of a threshold voltage. In FIG. 7, the memory cell MC may be a QLC, and a threshold voltage of the memory cell MC may be programmed to one of 16 states S1 to S16. Each of the states S1 to S16 may correspond to a distribution range of a threshold voltage Vth of memory cells MC, respectively.

Figure 8:
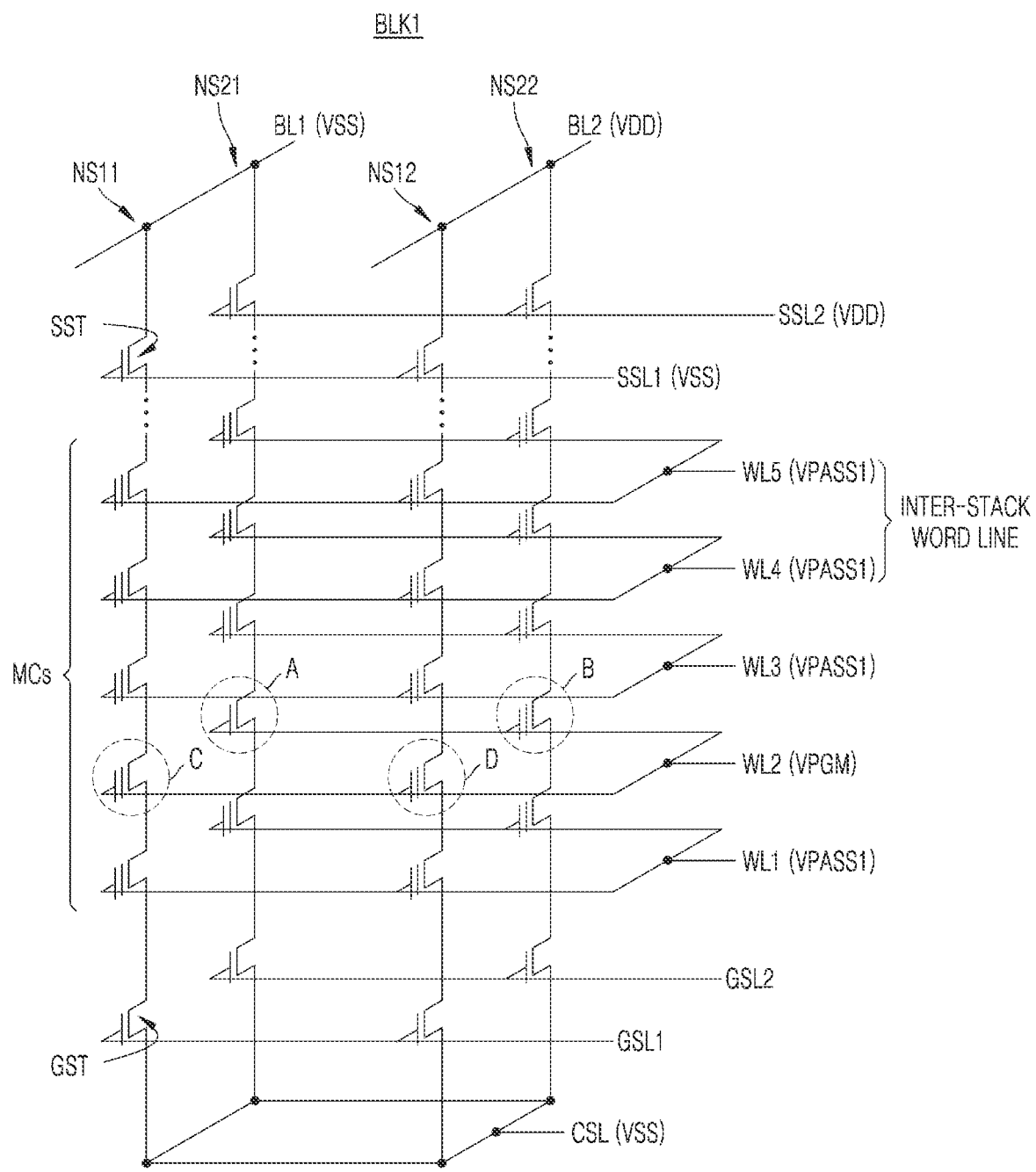
FIG. 8 is a circuit diagram illustrating a program bias condition according to an embodiment of the inventive concept.

FIG. 8 is a circuit diagram illustrating a program bias condition according to ab embodiment of the inventive concept. FIG. 8 shows, for convenience, the cell strings NS11 and NS21 connected to the first bit line BL1 and the cell strings NS12 and NS22 connected to the second bit line BL2 among the cell strings NS11 to NS33 (see FIG. 6).

Referring to FIG. 8, the first bit line BL1 is a program permission bit line to which a relatively low program permission voltage VPER (see FIGS. 9A and 9B), e.g., a ground voltage VSS, is applied, and the second bit line BL2 is a program inhibition bit line to which a relatively high program inhibition voltage VINH (see FIGS. 9A and 9B), e.g., a power source voltage VDD, is applied.

If it is assumed that the cell string NS21 between the cell strings NS11 and NS21 connected to the first bit line BL1 is selected, in a program period PROGRAM (see FIGS. 9A and 9B), a turn-off voltage of a level of the ground voltage VSS may be applied to the first string select line SSL1 connected to the cell string NS11, and a first turn-on voltage VSSL1, e.g., the power source voltage VDD, greater than or equal to the threshold voltage Vth of each string select transistor SST may be applied to the second string select line SSL2 connected to the cell string NS21.

The turn-off voltage of the level of the ground voltage VSS may be applied to the first and second ground select lines GSL1 and GSL2, and the ground voltage VSS may be applied to the common source line CSL. A program voltage VPGM (see FIGS. 9A and 9B) (e.g., 18 V) may be applied to a selected word line (e.g., WL2), a program pass voltage VPASS1 (see FIGS. 9A and 9B) (e.g., 8 V) may be applied to unselected word lines (e.g., WL1 and WL3), and the program pass voltage VPASS1 (see FIGS. 9A and 9B) may also be applied to inter-stack word lines (e.g., WL4 and WL5). Although not shown, the unselected word lines may also include the sixth, seventh, and eighth word lines WL6, WL7, and WL8. The program pass voltage VPASS1 may be set to a voltage by which a plurality of memory cells are turned on or always turned on.

Under this program bias condition, 18 V is applied to a gate of a memory cell A, and a channel voltage is 0 V. Because a strong electric field is formed between the gate of the memory cell A and a channel, the memory cell A is programmed. Meanwhile, because a channel voltage of a memory cell B is the power source voltage VDD, and because a weak electric field is formed between a gate of the memory cell B and a channel, the memory cell B is not programmed. Because channels of memory cells C and D are in a floating state, a channel voltage is boosted to a boosting level due to the program pass voltage VPASS1, and the memory cells C and D are not programmed.

Figure 9A:
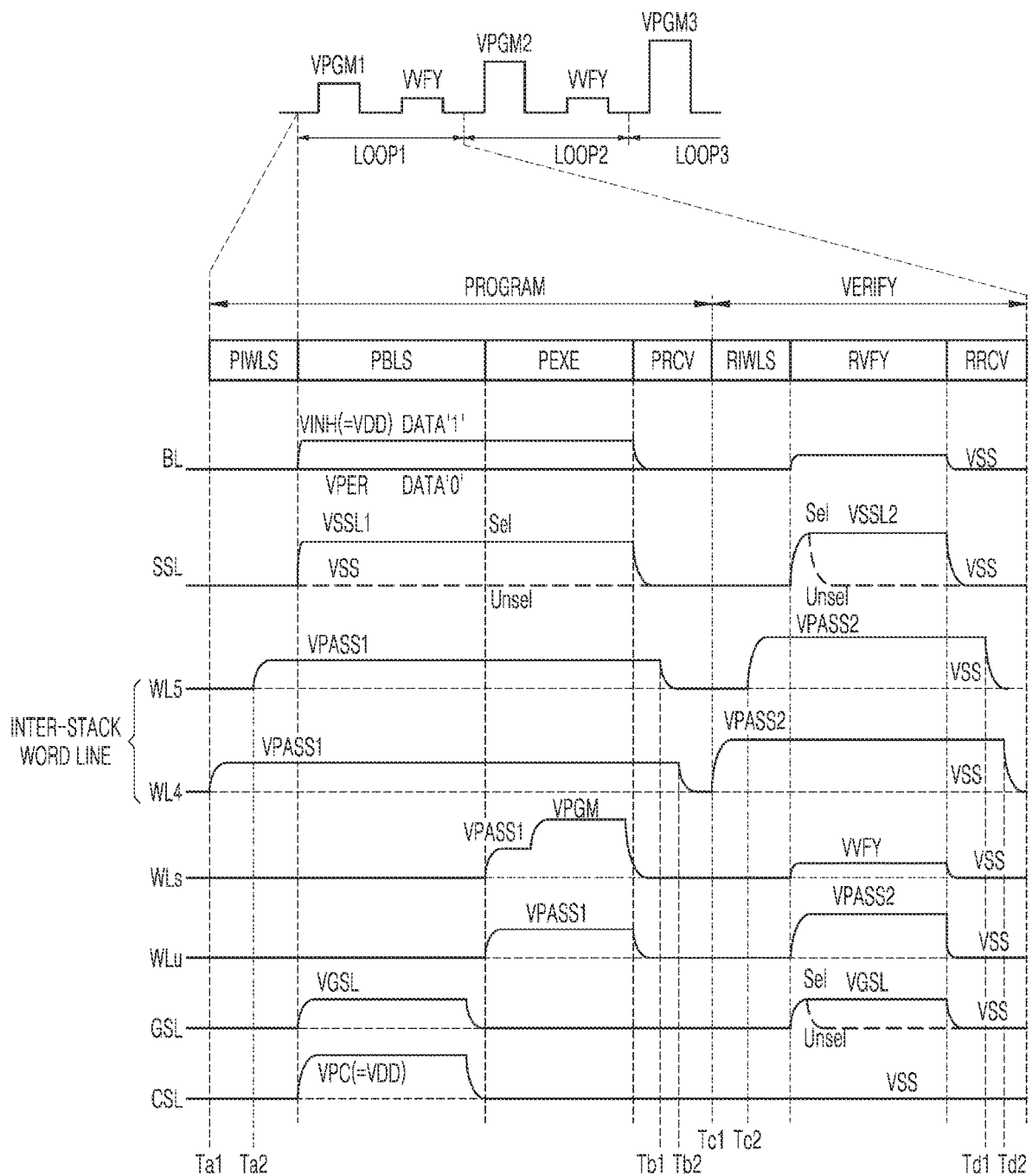
FIGS. 9A and 9B are timing diagrams for describing a program operation according to an embodiment of the inventive concept.
Figure 9B:
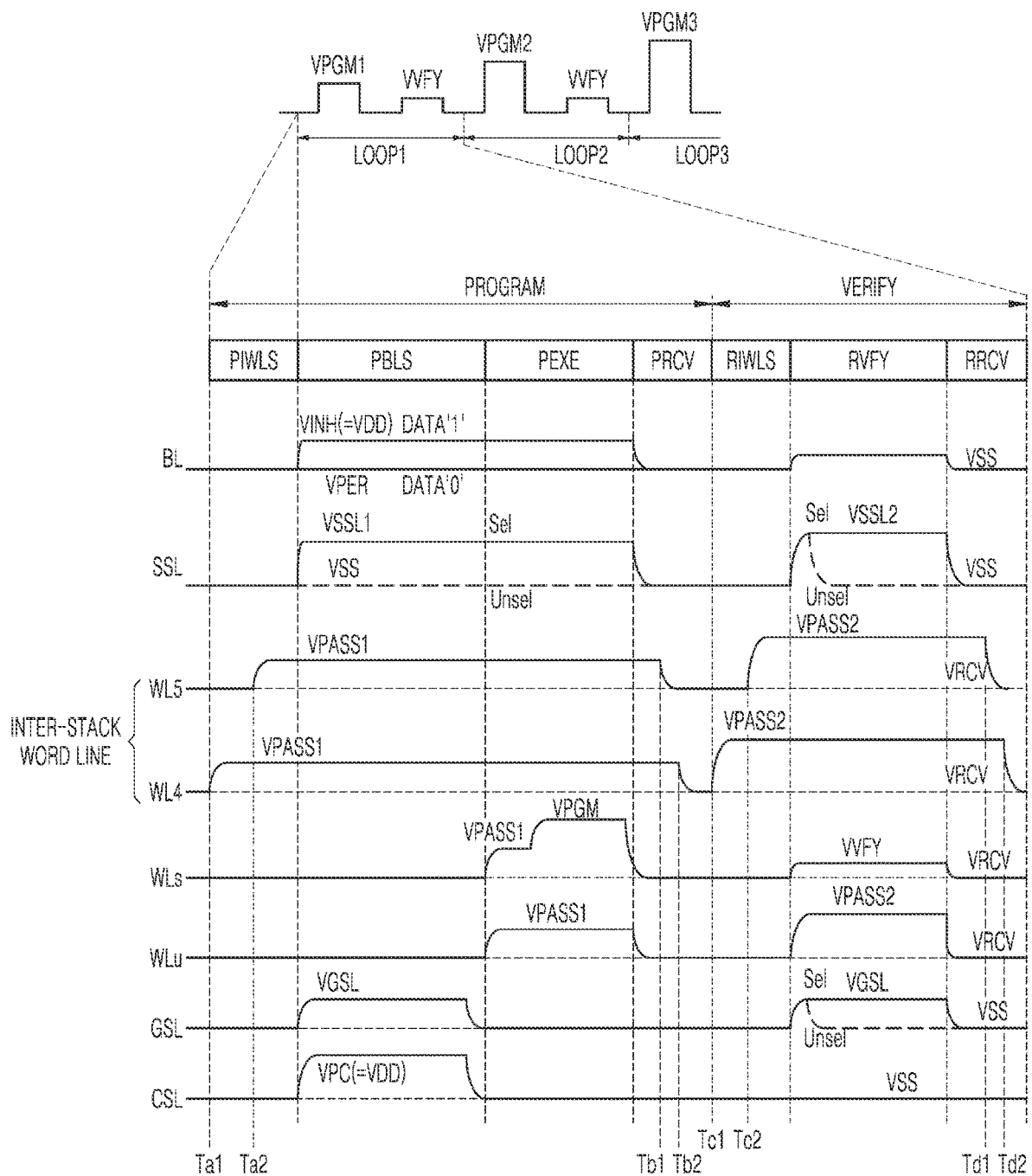

FIGS. 9A and 9B are timing diagrams for describing a program operation according to embodiments of the inventive concept. FIGS. 9A and 9B assume that, with respect to the memory cell A programmed in the cell string NS21, a selected word line WLs indicates the second word line WL2, unselected word lines WLu indicate the first, third, sixth, seventh, and eighth word lines WL1, WL3, WL6, WL7, and WL8, inter-stack word lines indicate the fourth and fifth word lines WL4 and WL5, a selected string select line SSL indicates the second string select line SSL2, an unselected string select line SSL indicates the first string select line SSL1, a selected ground select line GSL indicates the second ground select line GSL2, an unselected ground select line GSL indicates the first ground select line GSL1, a program permission bit line BL indicates the first bit line BL1, and a program inhibition bit line BL indicates the second bit line BL2.

Referring to FIG. 9A, for memory cells connected to the selected word line WLs, a plurality of program loops LOOP1, LOOP2, LOOP3, . . . may be sequentially performed until a program has completed according to an ISPP. As the plurality of program loops LOOP1, LOOP2, LOOP3, . . . are progressive, program voltages VPGM1, VPGM2, VPGM3, . . . may increase step-by-step. Each program loop LOOPi (i is a natural number) may include a program period PROGRAM, in which the program voltage VPGM is applied to the selected word line WLs to program a selected memory cell, and a verify period VERIFY, in which a verify voltage VVFY is applied to the selected word line WLs to verify whether the programming is successful.

The program period PROGRAM may include an inter-stack word line setup period PIWLS, a channel precharge and bit line setup period PBLS, a program execution period PEXE, and a program recovery period PRCV. For example, the program period PROGRAM may occur when a program operation is performed on memory cells connected to the selected word line WLs such as WL2.

In the inter-stack word line setup period PIWLS, a channel potential equalization operation on the inter-stack portion INT-ST may be performed by controlling the inter-stack word lines WL4 and WL5 adjacent to the inter-stack portion INT-ST. In the inter-stack word line setup period PIWLS, the program pass voltage VPASS1 may be applied to the inter-stack word lines WL4 and WL5. According to information indicating that a resistance value of the inter-stack word line WL4 among the inter-stack word lines WL4 and WL5 is greater than a resistance value of the inter-stack word line WL5, the program pass voltage VPASS1 is applied to the inter-stack word line WL4 at a time point Ta1 and applied to the inter-stack word line WL5 at a time point Ta2. That is, for channel potential equalization, the program pass voltage VPASS1 is first applied to the inter-stack word line WL4 having a large resistance value and later applied to the inter-stack word line WL5 having a small resistance value.

In the channel precharge and bit line setup period PBLS, an operation of initializing or precharging channels of a plurality of unselected cell strings (hereinafter, referred to as unselect string initial precharge (USIP)) may be performed before a program loop by using a gate induced drain leakage (GIDL) phenomenon. In the channel precharge and bit line setup period PBLS, the power source voltage VDD, which is the program inhibition voltage VINH, may be applied to the program inhibition bit line BL, and the ground voltage VSS of a program permission voltage level may be applied to the program permission bit line BL. The first turn-on voltage VSSL1 may be applied to the selected string select line SSL, and the turn-off voltage (e.g., the ground voltage VSS) may be applied to the unselected string select line SSL. A turn-on voltage VGSL may be applied to the ground select lines GSL, and the power source voltage VDD, which is a precharge voltage VPC, may be applied to the common source line CSL.

In the channel precharge and bit line setup period PBLS, the channels of the plurality of unselected cell strings may be initialized by a gate induced drain leakage (GIDL) phenomenon induced by a selected string select transistor SST connected to the selected string select line SSL and initialized by the GIDL phenomenon induced by ground select transistors GST connected to the ground select lines GSL. Thereafter, the first turn-on voltage VSSL1 may be maintained for the selected string select line SSL, the turn-off voltage may be applied to the unselected string select line SSL, the ground voltage VSS may be applied to the common source line CSL and the ground select lines GSL.

In the program execution period PEXE, the program pass voltage VPASS1 may be applied to the selected word line WLs and the unselected word lines WLu, and after a certain time elapses, the program voltage VPGM may be applied to the selected word line WLs.

In the program recovery period PRCV, the bit lines BL, the string select lines SSL, the selected word line WLs, the unselected word lines WLu, and the inter-stack word lines WL4 and WL5 may be recovered or set to the ground voltage VSS. In this case, the inter-stack word line WL5 having a small resistance value among the inter-stack word lines WL4 and WL5 may be recovered or set to the ground voltage VSS at a time point Tb1, and the inter-stack word line WL4 having a large resistance value may be recovered or set to the ground voltage VSS at a time point Tb2. That is, in the program recovery period PRCV, the inter-stack word line WL5 having a small resistance value may be program-recovered first, and the inter-stack word line WL4 having a large resistance value may be program-recovered later.

According to an embodiment, in the program recovery period PRCV, the selected word line WLs, the unselected word lines WLu, and the inter-stack word lines WL4 and WL5 may be recovered to a recovery voltage VRCV, as shown in FIG. 9B. The control circuit 124 of the nonvolatile memory device 120 may determine the recovery voltage VRCV by considering characteristics of memory cells MC having an initial state after a manufacturing process and/or characteristics of the memory cell A having a programmed state in a cell string. The recovery voltage VRCV may be set the same as an external power source voltage applied to the nonvolatile memory device 120 or an internal power source voltage generated from the external power source voltage in the nonvolatile memory device 120. In this case, the inter-stack word line WL5 having a small resistance value among the inter-stack word lines WL4 and WL5 may be recovered to the recovery voltage VRCV at the time point Tb1, and the inter-stack word line WL4 having a large resistance value may be recovered to the recovery voltage VRCV at the time point Tb2. That is, in the program recovery period PRCV, the inter-stack word line WL5 having a small resistance value may be program-recovered first, and the inter-stack word line WL4 having a large resistance value may be program-recovered later.

In FIGS. 9A and 9B, channel potential equalization of the inter-stack portion INT-ST in the program period PROGRAM may be implemented by applying the program pass voltage VPASS1 first to the inter-stack word line WL4 having a large resistance value and later to the inter-stack word line WL5 having a small resistance value in the inter-stack word line setup period PIWLS, and recovering first the inter-stack word line WL5 having a small resistance value to the ground voltage VSS or the recovery voltage VRCV and later recovering the inter-stack word line WL4 having a large resistance value to the ground voltage VSS or the recovery voltage VRCV in the program recovery period PRCV.

In FIG. 9A, the verify period VERIFY may include the inter-stack word line setup period RIWLS, a verify read period RVFY, and a read recovery period RRCV. Similar to the inter-stack word line setup period PIWLS of the program period PROGRAM, in the inter-stack word line setup period PIWLS, a read pass voltage VPASS2 may be applied first to the inter-stack word line WL4 having a large resistance value and later to the inter-stack word line WL5 having a small resistance value. The read pass voltage VPASS2 may be applied to the inter-stack word line WL4 at a time point Tc1 and applied to the inter-stack word line WL5 at a time point Tc2. In an embodiment, the read pass voltage VPASS2 is higher than the program pass voltage VPASS1.

In the verify read period RVFY, the read pass voltage VPASS2, by which a memory cell is turned on or always turned on regardless of a program state of the memory cell, may be applied to the unselected word lines WLu, the verify voltage VVFY may be applied to the selected word line WLs, the turn-on voltage VGSL may be applied to the selected ground select line GSL, and the turn-off voltage (i.e., the ground voltage VSS) may be applied to the unselected ground select line GSL.

In the read recovery period RRCV, the bit lines BL, the string select lines SSL, the selected word line WLs, the unselected word lines WLu, and the inter-stack word lines WL4 and WL5 may be recovered or set to the ground voltage VSS. Similar to the program recovery period PRCV of the program period PROGRAM, in the read recovery period RRCV, the inter-stack word line WL5 having a small resistance value may be first read-recovered, and the inter-stack word line WL4 having a large resistance value may be read-recovered later. The inter-stack word line WL5 may be first recovered to the ground voltage VSS at a time point Td1, and the inter-stack word line WL4 may be recovered to the ground voltage VSS at a time point Td2.

According to an embodiment, in the read recovery period RRCV, the selected word line WLs, the unselected word lines WLu, and the inter-stack word lines WL4 and WL5 may be recovered to the recovery voltage VRCV as shown in FIG. 9B. The inter-stack word line WL5 having a small resistance value among the inter-stack word lines WL4 and WL5 may be recovered or set to the recovery voltage VRCV at the time point Td1, and the inter-stack word line WL4 having a large resistance value may be recovered or set to the recovery voltage VRCV at the time point Td2. That is, in the read recovery period RRCV, the inter-stack word line WL5 having a small resistance value may be first recovered, and the inter-stack word line WL4 having a large resistance value may be recovered later.

In FIGS. 9A and 9B, channel potential equalization of the inter-stack portion INT-ST in the verify period VERIFY may be implemented by applying the program pass voltage VPASS1 first to the inter-stack word line WL4 having a large resistance value and later to the inter-stack word line WL5 having a small resistance value in the inter-stack word line setup period PIWLS, and recovering first the inter-stack word line WL5 having a small resistance value to the ground voltage VSS and later recovering the inter-stack word line WL4 having a large resistance value to the ground voltage VSS in the read recovery period RRCV.

Figure 10:
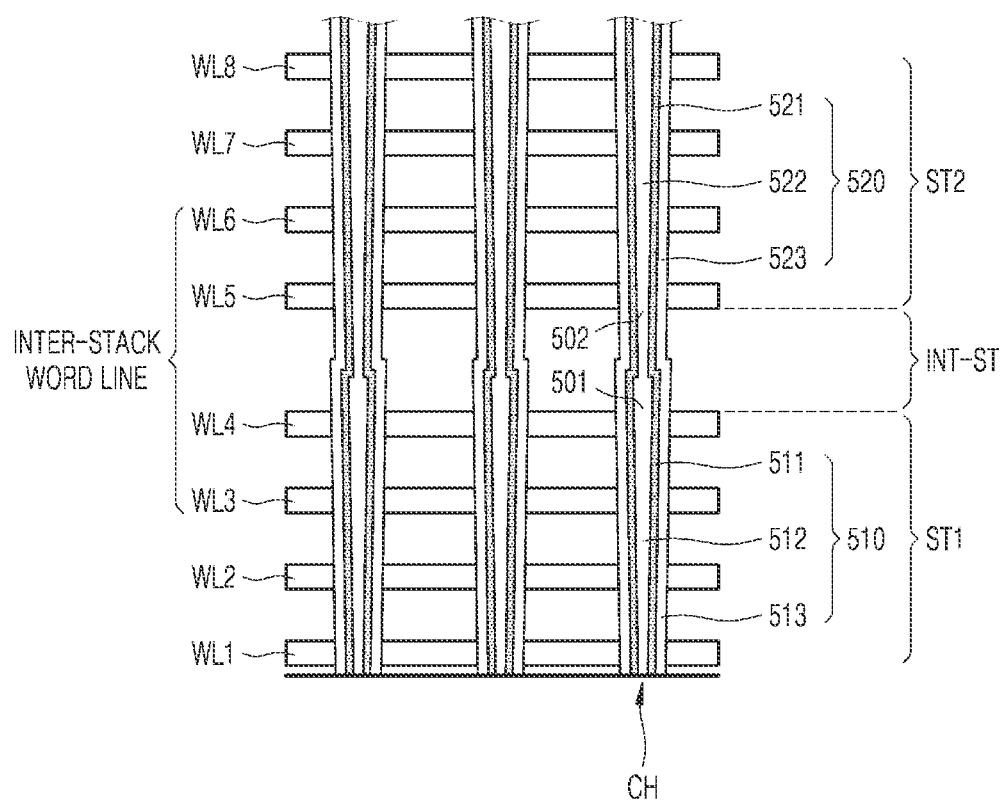
FIG. 10 is a cross-sectional view for describing another example of the inter-stack portion included in the memory block of FIG. 4.
Figure 11:
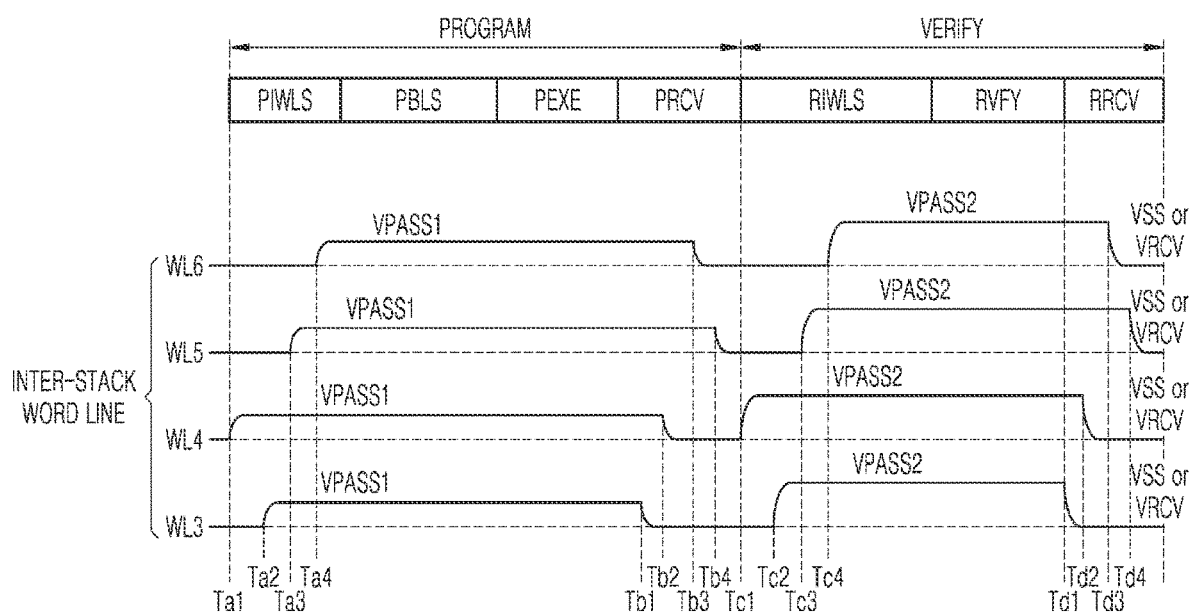
FIG. 11 is a timing diagram for describing a program operation according to an embodiment of the inventive concept.

FIG. 10 is a cross-sectional view for describing an example of the inter-stack portion INT-ST included in the memory block BLK1 of FIG. 4. FIG. 11 is a timing diagram for describing a program operation according to an embodiment of the inventive concept. In the program operation of FIG. 11, a timing diagram of inter-stack word lines WL3, WL4, WL5, and WL6 of FIG. 10 is shown, and a timing diagram of the selected word line WLs, the unselected word lines WLu, the selected/unselected string select lines SSL, the selected/unselected ground select lines GSL, and the program permission/inhibition bit lines BL described with reference to FIGS. 9A and 9B is omitted herein for simplification of drawing.

Referring to FIGS. 10 and 11, in the inter-stack word line setup period PIWLS of the program period PROGRAM, the program pass voltage VPASS1 is applied to the inter-stack word line WL4 of the first memory stack ST1 at a time point Ta1, applied to the inter-stack word line WL3 of the first memory stack ST1 at a time point Ta2, applied to the inter-stack word line WL5 of the second memory stack ST2 at a time point Ta3, and applied to the inter-stack word line WL6 of the second memory stack ST2 at a time point Ta4. That is, in the inter-stack word line setup period PIWLS of the program period PROGRAM, the program pass voltage VPASS1 is applied first to the inter-stack word line WL4 closer to the inter-stack portion INT-ST among the inter-stack word lines WL3 and WL4 having a large resistance value and applied later to the inter-stack word line WL6 farther from the inter-stack portion INT-ST among the inter-stack word lines WL5 and WL6 having a small resistance value.

In the program recovery period PRCV, the inter-stack word line WL3 of the first memory stack ST1 is recovered or set to the ground voltage VSS or the recovery voltage VRCV at a time point Tb1, the inter-stack word line WL4 of the first memory stack ST1 is recovered or set to the ground voltage VSS or the recovery voltage VRCV at a time point Tb2, the inter-stack word line WL6 of the second memory stack ST2 is recovered or set to the ground voltage VSS or the recovery voltage VRCV at a time point Tb3, and the inter-stack word line WL5 of the second memory stack ST2 is recovered or set to the ground voltage VSS or the recovery voltage VRCV at a time point Tb4. That is, in the program recovery period PRCV, the inter-stack word line WL3 farther from the inter-stack portion INT-ST among the inter-stack word lines WL3 and WL4 having a large resistance value is first program-recovered, and the inter-stack word line WL5 closer to the inter-stack portion INT-ST among the inter-stack word lines WL5 and WL6 having a small resistance value is program-recovered later.

In the inter-stack word line setup period RIWLS of the verify period VERIFY, the read pass voltage VPASS2 is applied to the inter-stack word line WL4 of the first memory stack ST1 at a time point Tc1, applied to the inter-stack word line WL3 of the first memory stack ST1 at a time point Tc2, applied to the inter-stack word line WL5 of the second memory stack ST2 at a time point Tc3, and applied to the inter-stack word line WL6 of the second memory stack ST2 at a time point Tc4. That is, in the inter-stack word line setup period RIWLS of the verify period VERIFY, the read pass voltage VPASS2 is applied first to the inter-stack word line WL4 closer to the inter-stack portion INT-ST among the inter-stack word lines WL3 and WL4 having a large resistance value and applied later to the inter-stack word line WL6 farther from the inter-stack portion INT-ST among the inter-stack word lines WL5 and WL6 having a small resistance value. In an embodiment, the read pass voltage VPASS2 is higher than the program pass voltage VPASS1.

In the read recovery period RRCV of the verify period VERIFY, the inter-stack word line WL3 of the first memory stack ST1 is recovered to the ground voltage VSS or the recovery voltage VRCV at a time point Td1, the inter-stack word line WL4 of the first memory stack ST1 is recovered to the ground voltage VSS or the recovery voltage VRCV at a time point Td2, the inter-stack word line WL6 of the second memory stack ST2 is recovered to the ground voltage VSS or the recovery voltage VRCV at a time point Td3, and the inter-stack word line WL5 of the second memory stack ST2 is recovered to the ground voltage VSS or the recovery voltage VRCV at a time point Td4. That is, in the read recovery period RRCV of the verify period VERIFY, the inter-stack word line WL3 farther from the inter-stack portion INT-ST among the inter-stack word lines WL3 and WL4 having a large resistance value is first read-recovered, and the inter-stack word line WL5 closer to the inter-stack portion INT-ST among the inter-stack word lines WL5 and WL6 having a small resistance value is read-recovered later.

Figure 12:
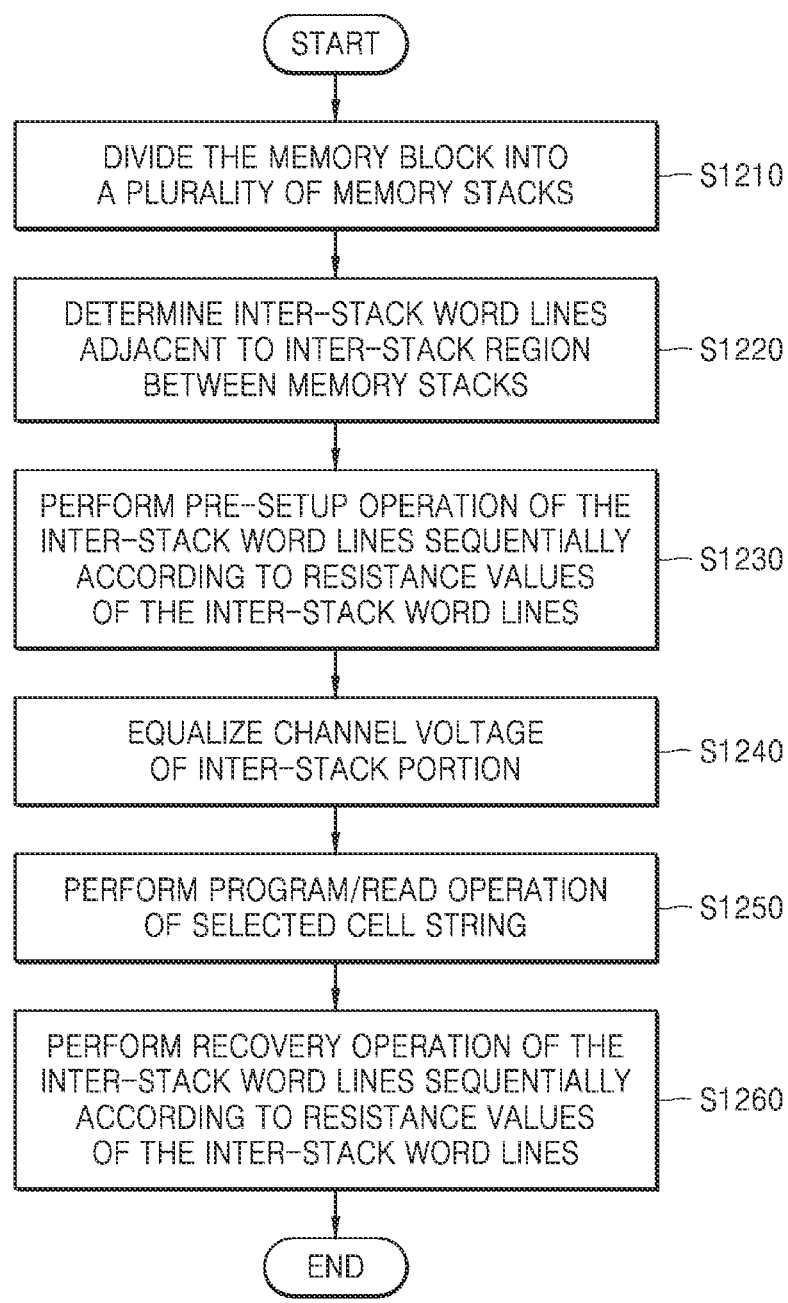
FIG. 12 is a flowchart illustrating a method of operating a nonvolatile memory device, according to an embodiment of the inventive concept.

FIG. 12 is a flowchart illustrating a method of operating a nonvolatile memory device, according to an embodiment of the inventive concept.

Referring to FIG. 12, in operation S1210, a memory cell array including a plurality of cell strings, in which a plurality of memory cells are respectively disposed in the vertical direction between a plurality of bit lines and a source line, is divided into a plurality of stacks. The memory cell or a memory block may be divided into two memory stacks as described with reference to FIG. 5 or divided into three memory stacks as to be described with reference to FIG. 15. Although not shown, it will be understood by those of ordinary skill in the art that the memory block may be divided into four or more memory stacks in a similar manner.

In operation S1220, the inter-stack word line manager 129 determines, as inter-stack word lines, some word lines adjacent to the inter-stack portions INT-ST among word lines of the plurality of memory stacks based on channel hole profile information. The channel hole profile information of the inter-stack word lines may be stored in the memory device 120 during a manufacturing process step of the nonvolatile memory device 120.

In operation S1230, the inter-stack word lines determined by the inter-stack word line manager 129 are sequentially set according to resistance values of the inter-stack word lines. The inter-stack word line manager 129 may first set an inter-stack word line having a large resistance value and later set an inter-stack word line having a small resistance value when the inter-stack word lines are set to the pass voltage. In the inter-stack word line setup period PIWLS, as shown in FIGS. 9A and 9B, the inter-stack word line manager 129 first sets the inter-stack word line WL4 having a large resistance value, which is adjacent to the inter-stack portion INT-ST, and later sets the inter-stack word line WL5 having a small resistance value. As shown in FIG. 11, the inter-stack word line manager 129 first sets the inter-stack word line WL4 closer to the inter-stack portion INT-ST among the inter-stack word lines WL3 and WL4 having a large resistance value and later sets the inter-stack word line WL6 farther from the inter-stack portion INT-ST among the inter-stack word lines WL5 and WL6 having a small resistance value.

In operation S1240, a channel voltage of the plurality of cell strings is initialized or equalized by sequentially setting up the inter-stack word lines of operation S1230 according to resistance values.

In operation S1250, a program or read operation on a selected cell string may be performed. The program or read operation on the selected cell string may be performed based on bias conditions of the program execution period PEXE or the verify read period RVFY described with reference to FIGS. 9A and 9B or a read period RD to be described with reference to FIG. 14.

In operation S1260, the inter-stack word lines are recovered in a recovery operation performed after the program or read operation. The inter-stack word line manager 129 may first recover an inter-stack word line having a small resistance value and later recover an inter-stack word line having a large resistance value when the inter-stack word lines are recovered to the ground voltage VSS or the recovery voltage VRCV. In the program recovery period PRCV and the read recovery period RRCV, as shown in FIGS. 9A and 9B, the inter-stack word line manager 129 first recovers the inter-stack word line WL3 having a smaller resistance value among the inter-stack word lines WL3 and WL4 and later recovers the inter-stack word line WL3 having a greater resistance value. As shown in FIG. 11, the inter-stack word line manager 129 first recovers the inter-stack word line WL3 farther from the inter-stack portion INT-ST among the inter-stack word lines WL3 and WL4 having a large resistance value and later recovers the inter-stack word line WL5 closer to the inter-stack portion INT-ST among the inter-stack word lines WL5 and WL6 having a small resistance value.

Figure 13:
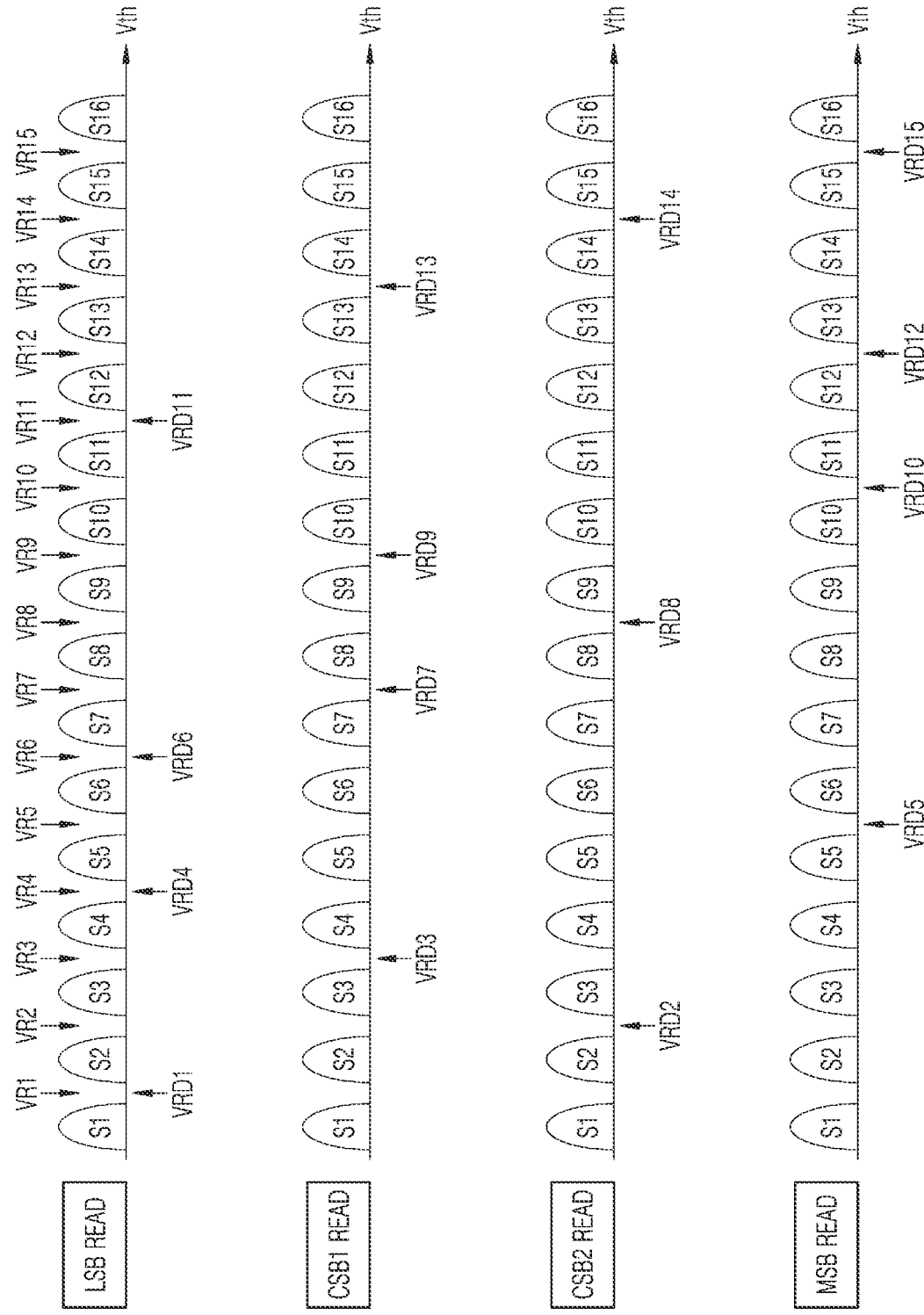
FIG. 13 illustrates a read operation associated with the threshold voltage distribution of the memory cells shown in FIG. 7.

FIG. 13 illustrates a read operation associated with the threshold voltage distribution of the memory cells shown in FIG. 7.

Referring to FIGS. 2, 7, and 13, when each of the memory cells is a QLC, a state of each of the memory cells may correspond to one of 16 states, e.g., first to sixteenth states S1 to S16. Memory cells connected to one word line WL may include a least significant bit (LSB) page, a first center significant bit (CSB1) page, a second center significant bit (CSB2) page, and a most significant bit (MSB) page.

The control circuit 124 may perform an operation of searching for valley positions VR1 to VR15 of a threshold voltage of a memory cell, an operation of inferring optimal read voltages (e.g., first to fifteenth read voltages VRD1 to VRD15) based on the valley positions VR1 to VR15, and a page read operation on each of the LSB page, the CSB1 page, the CSB2 page, and the MSB page by using the first to fifteenth read voltages VRD1 to VRD15.

In the read operation on the LSB page, the eleventh and twelfth states S11 and S12 may be determined by applying the eleventh read voltage VRD11 to the selected word line WL, and then the sixth and seventh states S6 and S7, the fourth and fifth states S4 and S5, and the first and second states S1 and S2 may be determined by sequentially applying the sixth read voltage VRD6, the fourth read voltage VRD4, and the first read voltage VRD1 to the selected word line WL, respectively.

In the read operation on the CSB1 page, the memory device 120 may determine the thirteenth and fourteenth states S13 and S14, the ninth and tenth states S9 and S10, the seventh and eighth states S7 and S8, and the third and fourth states S3 and S4 may be determined by sequentially applying the thirteenth read voltage VRD13, the ninth read voltage VRD9, the seventh read voltage VRD7, and the third read voltage VRD3 to the selected word line WL, respectively.

In the read operation on the CSB2 page, the memory device 120 may determine the fourteenth and fifteenth states S14 and S15, the eighth and ninth states S8 and S9, and the second and third states S2 and S3 by sequentially applying the fourteenth read voltage VRD14, the eighth read voltage VRD8, and the second read voltage VRD2 to the selected word line WL, respectively.

In the read operation on the MSB page, the memory device 120 may determine the fifteenth and sixteenth states S15 and S16, the twelfth and thirteenth states S12 and S13, the tenth and eleventh states S10 and S11, and the fifth and sixth states S5 and S6 by sequentially applying the fifteenth read voltage VRD15, the twelfth read voltage VRD12, the tenth read voltage VRD10, and the fifth read voltage VRD5 to the selected word line WL, respectively.

Figure 14:
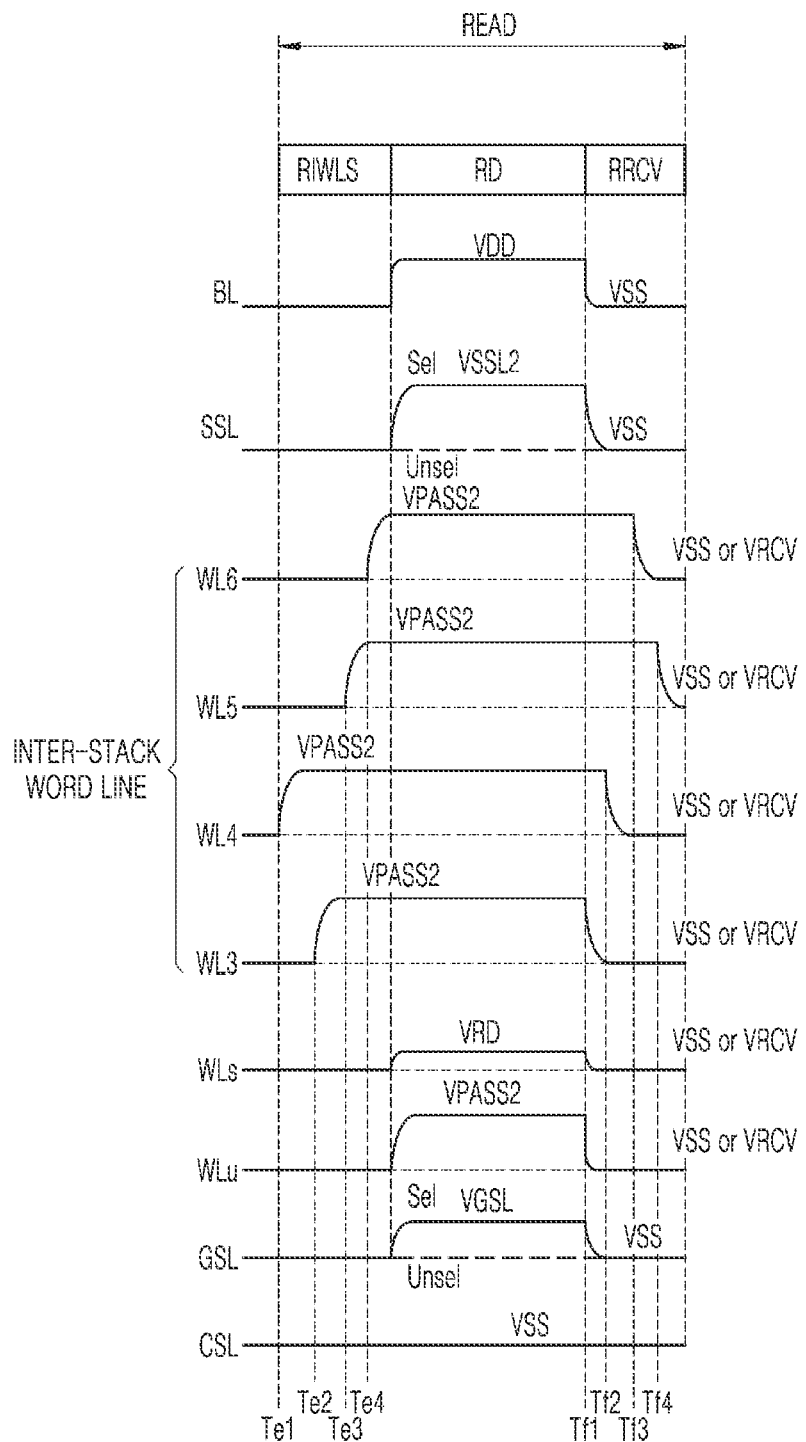
FIG. 14 is a timing diagram for describing a read operation according to an embodiment of the inventive concept.

FIG. 14 is a timing diagram for describing a read operation according to an embodiment of the inventive concept. The read operation of FIG. 14 may be similar to the verify period VERIFY of the program operation of FIG. 9.

Referring to FIGS. 8, 10, and 14, a read period READ includes the inter-stack word line setup period RIWLS, a read period RD, and a read recovery period RRCV. Similar to the inter-stack word line setup period PIWLS of the verify period VERIFY, in the inter-stack word line setup period PIWLS, the read pass voltage VPASS2 is applied first to the inter-stack word line WL4 closer to the inter-stack portion INT-ST among the inter-stack word lines WL3 and WL4 having a large resistance value and applied later to the inter-stack word line WL6 farther from the inter-stack portion INT-ST among the inter-stack word lines WL5 and WL6 having a small resistance value. The read pass voltage VPASS2 is applied to the inter-stack word line WL4 of the first memory stack ST1 at a time point Te1, applied to the inter-stack word line WL3 of the first memory stack ST1 at a time point Te2, applied to the inter-stack word line WL5 of the second memory stack ST2 at a time point Te3, and applied to the inter-stack word line WL6 of the second memory stack ST2 at a time point Te4.

In the read period RD, the read pass voltage VPASS2, by which a memory cell is always turned on regardless of a program state of the memory cell, may be applied to the unselected word lines WLu, the read voltage VRD of FIG. 12 may be applied to the selected word line WLs, the turn-on voltage VGSL may be applied to the selected ground select line GSL, and the turn-off voltage (i.e., the ground voltage VSS) may be applied to the unselected ground select line GSL.

In the read recovery period RRCV, the selected word line WLs, the unselected word lines WLu, and the inter-stack word lines WL4 and WL5 may be recovered or set to the ground voltage VSS or the recovery voltage VRCV. Similar to the read recovery period RRCV of the verify period VERIFY, in the read recovery period RRCV, the inter-stack word line WL3 farther from the inter-stack portion INT-ST among the inter-stack word lines WL3 and WL4 having a large resistance value is first read-recovered, and the inter-stack word line WL5 closer to the inter-stack portion INT-ST among the inter-stack word lines WL5 and WL6 having a small resistance value is read-recovered later. The inter-stack word line WL3 of the first memory stack ST1 is recovered or set to the ground voltage VSS or the recovery voltage VRCV at a time point Tf1, the inter-stack word line WL4 of the first memory stack ST1 is recovered or set to the ground voltage VSS or the recovery voltage VRCV at a time point Tf2, the inter-stack word line WL6 of the second memory stack ST2 is recovered or set to the ground voltage VSS or the recovery voltage VRCV at a time point Tf3, and the inter-stack word line WL5 of the second memory stack ST2 is recovered or set to the ground voltage VSS or the recovery voltage VRCV at a time point Tf4.

FIG. 15 is a cross-sectional view illustrating a memory block BLK1a according to an embodiment of the inventive concept. Hereinafter, a subscript (e.g., a in BLK1a) attached to the same reference sign in different drawings is used to identify a plurality of circuits configured to perform similar functions or the same function. For example, memory block of the memory cell array 122 of FIG. 2 may be replaced with the memory block BLK1a.

Referring to FIGS. 2 and 15, the memory block BLK1a include three memory stacks ST1, ST2, and ST3. Inter-stack portions 1510 and 1520 are included between the memory stacks ST1, ST2, and ST3. For example, a first inter-stack portion 1510 is located between stacks ST1 and ST2 and a second inter-stack portion 1520 is located between stacks ST2 and ST3.

The inter-stack word line manager 129 may store channel hole profile information of word lines adjacent to the inter-stack portions 1510 and 1520. The channel hole profile information may be defined in a manufacturing process step. The channel hole profile information may also be store outside of the inter-stack word line manager 129 and be accessible to the inter-stack word line manager 129. The inter-stack word line manager 129 may determine, as inter-stack word lines 1512 and 1522, one word line adjacent to each of the inter-stack portions 1510 and 1520 among word lines of each of the memory stacks ST1, ST2, and ST3 based on the channel hole profile information. According to an embodiment, the inter-stack word line manager 129 determines, as inter-stack word lines 1514 and 1524, two word lines adjacent to each of the inter-stack portions 1510 and 1520 among the word lines of each of the memory stacks ST1, ST2, and ST3 based on the channel hole profile information.

The inter-stack word line manager 129 may perform a channel voltage equalization operation of a plurality of memory stacks while differently controlling setup time points for applying the pass voltage to the inter-stack word lines 1512, 1522, 1514, and 1524 according to resistance values of the inter-stack word lines 1512, 1522, 1514, and 1524 The inter-stack word line manager 129 may first set an inter-stack word line having a large resistance value and later set an inter-stack word line having a small resistance value when the inter-stack word lines 1512, 1522, 1514, and 1524 are set to the pass voltage.

The inter-stack word line manager 129 may perform a channel voltage equalization operation of the plurality of memory stacks while differently controlling recovery time points for applying the ground voltage VSS or the recovery voltage VRCV to the inter-stack word lines 1512, 1522,

1514, and 1524 according to resistance values of the inter-stack word lines 1412, 1422, 1414, and 1424. The inter-stack word line manager 129 may first recover an inter-stack word line having a small resistance value and later recover an inter-stack word line having a large resistance value when the inter-stack word lines 1512, 1522, 1514, and 1524 are recovered to the ground voltage VSS or the recovery voltage VRCV.

Figure 16:
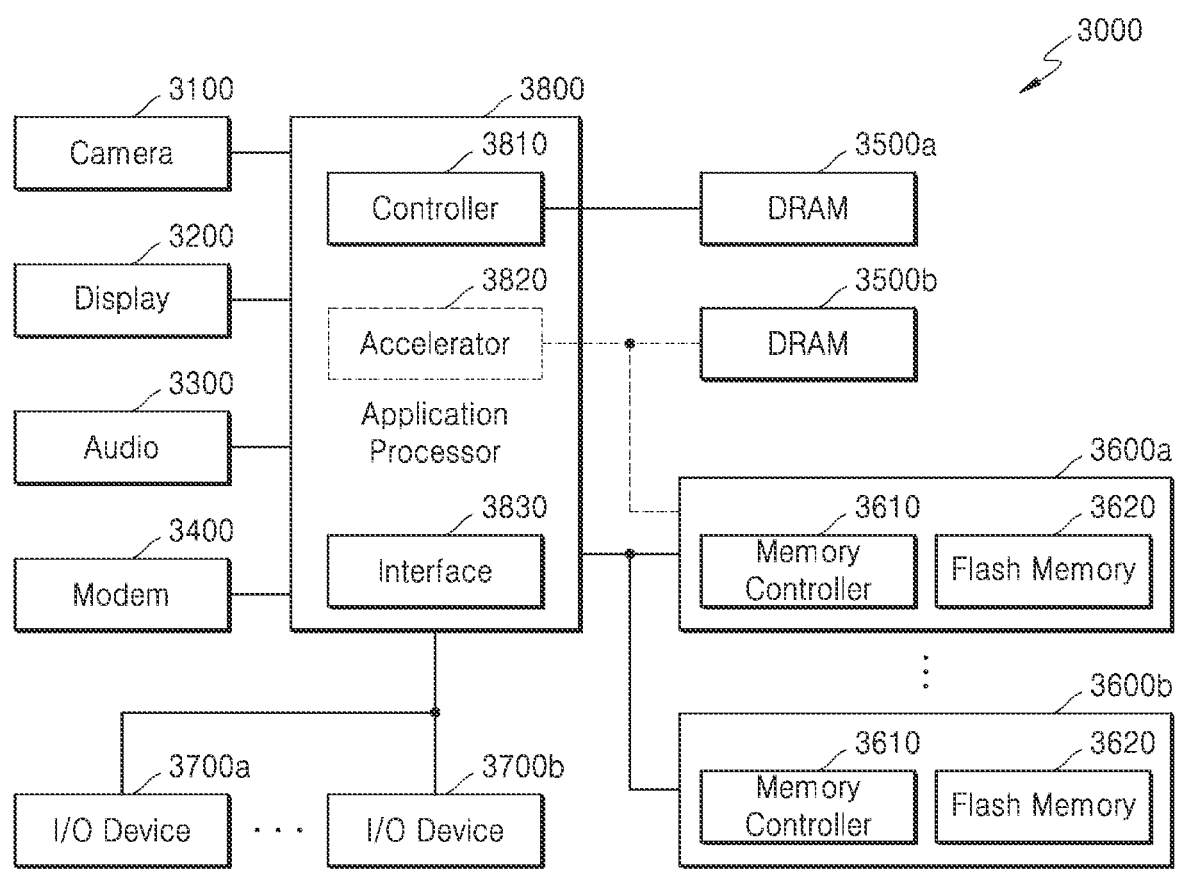
FIG. 16 is a block diagram illustrating a system including a nonvolatile memory device, according to an embodiment of the inventive concept.

FIG. 16 is a block diagram illustrating a system 3000 including a nonvolatile memory device, according to an embodiment of the inventive concept.

Referring to FIG. 16, the system 3000 may include a camera 3100, a display 3200, an audio processor 3300, a modem 3400, dynamic random access memories (DRAMs) 3500*a* and 3500*b*, flash memory devices 3600*a* and 3600*b*, I/O devices 3700*a* and 3700*b*, and an application processor (hereinafter, referred to as "AP") 3800. The system 3000 may be implemented by a laptop computer, a mobile phone, a smartphone, a tablet personal computer (PC), a wearable device, a healthcare device, or an Internet of Things (IOT) device. Alternatively, the system 3000 may be implemented by a server or a PC.

The camera 3100 may capture a still image or a video under control by a user and store the captured image/video data or transmit the same to the display 3200. The audio processor 3300 may process audio data included in content of the flash memory devices 3600*a* and 3600*b* or a network. The modem 3400 may modulate and transmit a signal and demodulate a modulated signal to an original signal at a reception side, for wired/wireless data transmission and reception. The I/O devices 3700*a* and 3700*b* may include devices configured to provide a digital input function and/or a digital output function, such as a universal serial bus (USB) or a storage, a digital camera, an SD card, a digital versatile disc (DVD), a network adapter, and a touchscreen.

The AP 3800 may control a general operation of the system 3000. The AP 3800 may control the display 3200 so that a portion of content stored in the flash memory devices 3600*a* and 3600*b* is displayed on the display 3200. When a user input is received via the I/O devices 3700*a* and 3700*b*, the AP 3800 may perform a control operation corresponding to the user input. The AP 3800 may include a controller 3810 and an interface 3830 and include an accelerator block, which is a circuit for artificial intelligence (AI) data computation, or have an accelerator chip 3820, which is separated from the AP 3800. The DRAM 3500*b* may be additionally mounted on the accelerator block or the accelerator chip 3820. An accelerator is a functional block configured to expertly perform a particular function and may include a graphics processing unit (GPU), which is a functional block configured to expertly perform graphics data processing, a neural processing unit (NPU), which is a block configured to expertly perform AI computation and inference, and a data processing unit (DPU), which is a block configured to expertly perform data transmission.

The system 3000 may include a plurality of DRAMs 3500*a* and 3500*b*. The AP 3800 may control the DRAMs 3500*a* and 3500*b* by a command according to a Joint Electron Device Engineering Council (JEDEC) standard and a mode register set (MRS) or perform communication by setting a DRAM interface protocol to use company-specific functions, such as low voltage/high speed/reliability, and cyclic redundancy check (CRC)/error correction code (ECC) functions. For example, the AP 3800 may communicate with the DRAM 3500*a* by using an interface according to a JEDEC standard, such as fourth generation low power double data rate (LPDDR4) or fifth generation LPDDR (LPDDR5), and the accelerator block or the accelerator chip 3820 may perform communication by setting a new DRAM interface protocol to control the DRAM 3500*b* for an accelerator, which has a wider bandwidth than the DRAM 3500*a*.

Although FIG. 16 shows only the DRAMS 3500*a* and 3500*b*, the inventive concept is not limited thereto, and any memory, such as phase change random access memory (PRAM), static random access memory (SRAM), magnetic random access memory (MRAM), resistive random access memory (RRAM), ferroelectric random access memory (FRAM), or hybrid RAM, may be used only if a bandwidth, a reaction speed, and a voltage condition of the AP 3800 or the accelerator chip 3820 are satisfied. The DRAMs 3500*a* and 3500*b* have a relatively lower latency and narrower bandwidth than the I/O devices 3700*a* and 3700*b* or the flash memory devices 3600*a* and 3600*b*. The DRAMs 3500*a* and 3500*b* may be initialized when the system 3000 is turned on, and used as a temporary storage of an operating system and application data after the operating system and the application data are loaded therein, or used as an execution space of various kinds of software codes.

In the DRAMs 3500*a* and 3500*b*, the four fundamental arithmetic operations of addition/subtraction/multiplication/division, a vector operation, an address operation, or a fast Fourier transform (FFT) operation may be performed. In addition, in the DRAMs 3500*a* and 3500*b*, a functional function used for inference may be performed. Herein, inference may be performed in a deep learning algorithm using an artificial neural network. The deep learning algorithm may include a training step of training a model by using various pieces of data and an inference step of recognizing data by using the trained model. As an embodiment, an image captured by a user using the camera 3100 may be signal-processed and stored in the DRAM 3500*b*, and the accelerator block or the accelerator chip 3820 may perform AI data computation for recognizing data by using data stored in the DRAM 3500*b* and a function used for inference.

The system 3000 may include a plurality of storages or a plurality of flash memory devices 3600*a* and 3600*b*, which have a greater capacity than the DRAMs 3500*a* and 3500*b*. The accelerator block or the accelerator chip 3820 may perform the training step and the AI data computation by using the flash memory devices 3600*a* and 3600*b*. As an embodiment, the flash memory devices 3600*a* and 3600*b* may more efficiently perform the training step and the inference step (the AI data computation), which the AP 3800 and/or the accelerator chip 3820 performs, by using a computation device included in a memory controller 3610. The flash memory devices 3600*a* and 3600*b* may store a picture taken using the camera 3100 or store data received via a data network. For example, augmented reality, virtual reality, high definition (HD), or ultra high definition (UHD) content may be stored.

The flash memory devices 3600*a* and 3600*b* may include the inter-stack word line manager 129 described with reference to FIGS. 1 to 15. The inter-stack word line manager 129 may store channel hole profile information of word lines adjacent to an inter-stack portion defined in a manufacturing process step. The channel hole profile information may be stored in the flash memory devices 3600*a* and 3600*b* outside of the inter-stack word line manager 129, but be accessible to the inter-stack word line manager 129. The inter-stack word line manager 129 may determine, as inter-stack word lines, some word lines adjacent to inter-stack portions among word lines of memory stacks based on the channel hole profile information. The inter-stack word line manager 129 may perform a channel voltage equalization operation of a plurality of memory stacks while differently controlling setup time points for applying a pass voltage to the inter-stack word lines, according to sizes of a channel hole of the inter-stack word lines. The inter-stack word line manager 129 may first set an inter-stack word line having a larger channel hole and later set an inter-stack word line having a smaller channel hole when the inter-stack word lines are set to the pass voltage. The inter-stack word line manager 129 may perform a channel voltage equalization operation of the plurality of memory stacks while differently controlling recovery time points for applying a ground voltage to the inter-stack word lines, according to sizes of the channel hole of the inter-stack word lines. The inter-stack word line manager 129 may first recover an inter-stack word line having a smaller channel hole and later recover an inter-stack word line having a larger channel hole when the inter-stack word lines are recovered to the ground voltage.

While the inventive concept has been particularly shown and described with reference to embodiments thereof, it will be understood that various changes in form and details may be made therein without departing from the spirit and scope of the following claims.

What is claimed is:

1. A nonvolatile memory device comprising:
a memory cell array comprising a plurality of cell strings in which a plurality of memory cells are disposed in a vertical direction, respectively, wherein the memory cell array is divided into a plurality of memory stacks disposed in the vertical direction, inter-stack portions are disposed between the plurality of memory stacks, word lines of the plurality of memory cells are stacked in the vertical direction in each of the plurality of memory stacks, and a channel hole passes through the word lines of each of the plurality of memory stacks; and
a control circuit configured to determine, as inter-stack word lines, some word lines adjacent to the inter-stack portions among the word lines of each of the plurality of memory stacks and perform a channel voltage equalization operation of the plurality of memory stacks while differently controlling setup time points for applying a pass voltage to the inter-stack word lines, according to sizes of the channel hole of the inter-stack word lines,
wherein the pass voltage is set to a voltage by which the plurality of memory cells are turned on.

2. The nonvolatile memory device of claim 1, wherein the control circuit is further configured to first set a first inter-stack word line among the inter-stack word lines having a larger channel hole and later set a second other inter-stack word line among the inter-stack word lines having a smaller channel hole when the inter-stack word lines are set to the pass voltage.

3. The nonvolatile memory device of claim 1, wherein the control circuit is further configured to perform the channel voltage equalization operation of the plurality of memory stacks while differently controlling recovery time points for applying a recovery voltage to the inter-stack word lines, according to sizes of the channel hole of the inter-stack word lines.

4. The nonvolatile memory device of claim 3, wherein the recovery voltage is set to a ground voltage, an external power source voltage applied to the nonvolatile memory device, or an internal power source voltage generated from the external power source voltage in the nonvolatile memory device.

5. The nonvolatile memory device of claim 3, wherein the control circuit is further configured to first recover a first inter-stack word line among the inter-stack word lines having a smaller channel hole and later recover a second other inter-stack word line among the inter-stack word lines having a larger channel hole when the inter-stack word lines are recovered to the recovery voltage.

6. A method of operating a nonvolatile memory device, the method comprising:
dividing, into a plurality of memory stacks, a memory cell array comprising a plurality of cell strings in which a plurality of memory cells are disposed in a vertical direction, respectively, wherein inter-stack portions are disposed between the plurality of memory stacks, word lines of the plurality of memory cells are stacked in the vertical direction in each of the plurality of memory stacks, and a channel hole passes through the word lines of each of the plurality of memory stacks;
determining, as inter-stack word lines, some word lines adjacent to the inter-stack portions among the word lines of each of the plurality of memory stacks; and
performing a channel voltage equalization operation of the plurality of memory stacks while differently controlling setup time points for applying a pass voltage to the inter-stack word lines, according to sizes of the channel hole of the inter-stack word lines,
wherein the pass voltage is set to a voltage by which the plurality of memory cells are turned on.

7. The method of claim 6, further comprising storing, in the nonvolatile memory device, channel hole profile information indicating the some word lines in a manufacturing process step of the nonvolatile memory device.

8. The method of claim 7, wherein the determining of the inter-stack word lines includes selecting some of the word lines adjacent to the inter-stack portions, based on the channel hole profile information.

9. The method of claim 6, wherein the performing of the channel voltage equalization operation of the plurality of memory stacks further comprises first setting a first inter-stack word line among the inter-stack word lines, which has a larger channel hole, to the pass voltage and later setting a second other inter-stack word line among the inter-stack word lines, which has a smaller channel hole, to the pass voltage.

10. The method of claim 6, wherein the plurality of memory stacks comprise a first memory stack, a second memory stack stacked on the first memory stack, and a first inter-stack portion disposed between the first memory stack and the second memory stack, and
the performing of the channel voltage equalization operation of the plurality of memory stacks further comprises:
setting a first inter-stack word line among the inter-stack word lines at a top of the first memory stack, which is adjacent to the first inter-stack portion, to the pass voltage at a first time point; and
setting a second inter-stack word line among the inter-stack word lines at a bottom of the second memory stack, which is adjacent to the first inter-stack portion, to the pass voltage at a second time point after the first time point.

11. The method of claim 10, further comprising performing a program, a verify read, or a read operation on a selected cell string among the plurality of cell strings after the second time point.

12. The method of claim 6, wherein the plurality of memory stacks comprise a first memory stack, a second memory stack stacked on the first memory stack, and a first inter-stack portion disposed between the first memory stack and the second memory stack, and
the performing of the channel voltage equalization operation of the plurality of memory stacks further comprises:
setting a first inter-stack word line among the inter-stack word lines at a top of the first memory stack, which is adjacent to the first inter-stack portion, to the pass voltage at a first time point;
setting a second inter-stack word line among the inter-stack word lines, which is beneath the first inter-stack word line, to the pass voltage at a second time point after the first time point;
setting a third inter-stack word line among the inter-stack word lines at a bottom of the second memory stack, which is adjacent to the first inter-stack portion, to the pass voltage at a third time point after the second time point; and
setting a fourth inter-stack word line among the inter-stack word lines, which is disposed on the third inter-stack word line, to the pass voltage at a fourth time point after the third time point.

13. The method of claim 12, further comprising performing a program, a verify read, or a read operation on a selected cell string among the plurality of cell strings after the fourth time point.

14. A method of operating a nonvolatile memory device, the method comprising:
dividing, into a plurality of memory stacks, a memory cell array comprising a plurality of cell strings in which a plurality of memory cells are disposed in a vertical direction, respectively, wherein inter-stack portions are disposed between the plurality of memory stacks, word lines of the plurality of memory cells are stacked in the vertical direction in each of the plurality of memory stacks, and a channel hole passes through the word lines of each of the plurality of memory stacks;
determining, as inter-stack word lines, some word lines adjacent to the inter-stack portions among the word lines of each of the plurality of memory stacks; and
performing a channel voltage equalization operation of the plurality of memory stacks while differently controlling recovery time points for applying a recovery voltage to the inter-stack word lines, according to sizes of the channel hole of the inter-stack word lines.

15. The method of claim 14, wherein the recovery voltage is set to a ground voltage, an external power source voltage applied to the nonvolatile memory device, or an internal power source voltage generated from the external power source voltage in the nonvolatile memory device.

16. The method of claim 14, further comprising storing, in the nonvolatile memory device, channel hole profile information indicating the some word lines defined in a manufacturing process step of the nonvolatile memory device.

17. The method of claim 16, wherein the determining of the inter-stack word lines includes selecting some of the word lines adjacent to the inter-stack portions, based on the channel hole profile information.

18. The method of claim 14, wherein the performing of the channel voltage equalization operation of the plurality of memory stacks further comprises first recovering a first inter-stack word line among the inter-stack word lines, which has a smaller channel hole among the inter-stack word lines, to the recovery voltage and later recovering a second other inter-stack word line among the inter-stack word lines, which has a larger channel hole to the recovery voltage.

19. The method of claim 14, wherein the plurality of memory stacks comprise a first memory stack, a second memory stack stacked on the first memory stack, and a first inter-stack portion disposed between the first memory stack and the second memory stack, and
the performing of the channel voltage equalization operation of the plurality of memory stacks further comprises:
recovering a second inter-stack word line among the inter-stack word lines at a bottom of the second memory stack, which is adjacent to the first inter-stack portion, to the recovery voltage at a first time point; and
recovering a first inter-stack word line among the inter-stack word lines at a top of the first memory stack, which is adjacent to the first inter-stack portion, to the recovery voltage at a second time point after the first time point.

20. The method of claim 14, wherein the plurality of memory stacks comprise a first memory stack, a second memory stack stacked on the first memory stack, and a first inter-stack portion disposed between the first memory stack and the second memory stack, and
the performing of the channel voltage equalization operation of the plurality of memory stacks further comprises:
recovering a second inter-stack word line among the inter-stack word lines, which is beneath a first inter-stack word line among the inter-stack word lines at a top of the first memory stack, to the recovery voltage at a first time point, the first inter-stack word line being adjacent to the first inter-stack portion;
recovering the first inter-stack word line to the recovery voltage at a second time point after the first time point;
recovering a fourth inter-stack word line among the inter-stack word lines, which is disposed on a third inter-stack word line among the inter-stack word lines at a bottom of the second memory stack, to the recovery voltage at a third time point after the second time point, the third inter-stack word line being adjacent to the first inter-stack portion; and
recovering the third inter-stack word line to the recovery voltage at a fourth time point after the third time point.

* * * * *